(12) United States Patent
Kim et al.

(10) Patent No.: US 10,937,917 B2
(45) Date of Patent: Mar. 2, 2021

(54) SOLAR CELL PANEL AND METHOD FOR MANUFACTURING THE SAME

(71) Applicant: LG ELECTRONICS INC., Seoul (KR)

(72) Inventors: Byongsu Kim, Seoul (KR); Juseok Kim, Seoul (KR); Seiyoung Mun, Seoul (KR); Sungho Chang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/368,228

(22) Filed: Mar. 28, 2019

(65) Prior Publication Data
US 2019/0305162 A1    Oct. 3, 2019

(30) Foreign Application Priority Data

Mar. 28, 2018   (KR) .................. 10-2018-0035877
Feb. 27, 2019   (KR) .................. 10-2019-0023132

(51) Int. Cl.
*H01L 31/048*    (2014.01)
*H01L 31/05*    (2014.01)
*H01L 31/18*    (2006.01)

(52) U.S. Cl.
CPC ...... *H01L 31/0488* (2013.01); *H01L 31/0481* (2013.01); *H01L 31/0504* (2013.01); *H01L 31/1876* (2013.01)

(58) Field of Classification Search
CPC ............ H01L 31/0488; H01L 31/0481; H01L 31/0504; H01L 31/1876
See application file for complete search history.

(56) References Cited

U.S. PATENT DOCUMENTS

| 2012/0055550 | A1  | 3/2012  | Buller et al. |
| 2012/0240982 | A1* | 9/2012  | Corneille ............ H01L 31/0488 136/251 |
| 2012/0317900 | A1* | 12/2012 | Den Boer ............ G02B 3/0056 52/173.3 |
| 2016/0284907 | A1* | 9/2016  | Inaba ................... H01L 31/048 |
| 2019/0006547 | A1* | 1/2019  | Watts ................ B32B 17/10036 |

FOREIGN PATENT DOCUMENTS

| EP | 3073536 A1    |   | 9/2016 |
| EP | 3285304 A1    |   | 2/2018 |
| JP | 2006-173298 A |   | 6/2006 |
| JP | 2006173298    | * | 6/2009 |

(Continued)

*Primary Examiner* — Jayne L Mershon
(74) *Attorney, Agent, or Firm* — Birch, Stewart, Kolasch & Birch, LLP

(57) ABSTRACT

A solar cell panel can include a solar cell; a sealing member including a first sealing member disposed on a first surface of the solar cell and a second sealing member disposed on a second surface of the solar cell; a first cover member disposed on the first sealing member and including a glass substrate; and a second cover member disposed on the second sealing member and including a glass substrate, in which the sealing member includes a central region and an outer region positioned outside the central region, and the outer region includes a reinforcing region having a thickness greater than a thickness of the central region.

11 Claims, 14 Drawing Sheets

(56) References Cited

FOREIGN PATENT DOCUMENTS

| | | |
|---|---|---|
| JP | 2013-110420 A | 6/2013 |
| JP | 2016-181660 A | 10/2016 |
| JP | 2016-195293 A | 11/2016 |
| KR | 10-2012-0036978 A | 4/2012 |
| KR | 10-2018-0005722 A | 1/2018 |
| WO | WO 2010/146389 A1 | 12/2010 |

* cited by examiner (a)

(b)

SOLAR CELL PANEL AND METHOD FOR MANUFACTURING THE SAME

CROSS-REFERENCE TO RELATED APPLICATION

This application claims priority to and the benefit of Korean Patent Application No. 10-2018-0035877 filed in the Republic of Korea on Mar. 28, 2018, and Korean Patent Application No. 10-2019-0023132 filed in the Republic of Korea on Feb. 27, 2019, the entire contents of all of these applications are incorporated herein by reference.

BACKGROUND OF THE INVENTION

Field of the Invention

Embodiments of the invention relate to a solar cell panel and a method for manufacturing the same, and, more particularly, to a solar cell panel having an improved structure and a method for manufacturing the same having an improved process.

Description of the Related Art

Since a solar cell is exposed to an external environment for a long time, it is manufactured in a form of a solar cell panel having a solar cell, a sealing member, and a cover member by a packaging process for protecting the solar cell.

The solar cell panel including various members is manufactured by a lamination process for applying heat and pressure. In a portion where a load due to a pressure during a lamination process is largely applied, a solar cell or a cover member may be broken or damaged. Further, a sealing member may flow or leak out to the outside from an edge portion of a solar cell panel due to the pressure during the lamination process, and a thickness of the sealing member at the edge portion may be smaller than a thickness of the other portion (for example, a central portion). Accordingly, the sealing member at the edge portion of the solar cell panel may not have a sufficient thickness to realize a desired sealing property. This problem may occur more seriously when a cover member includes a glass substrate, especially when each of cover members positioned on both sides includes a glass substrate.

In order to prevent such a problem, a method of reducing temperature and pressure during a lamination process and increasing a process time has been used in the conventional art. However, according to the method, time and cost of the lamination process may increase, and a frequency of breakage or damage of a solar cell or a cover member may be not greatly reduced even when the above method is used. As another example of the conventional art, a back sealing film thicker than a front sealing film is used as in an international patent publication No. WO2015/182755. Then, a material cost, a process time, and the like may be increased by using a thick back sealing film as a whole.

SUMMARY OF THE INVENTION

Therefore, embodiments of the invention have been made in view of the above problems, and embodiments of the invention are to provide a solar cell panel and a method for manufacturing a solar cell panel being able to improving productivity of a solar cell panel and reducing a defective rate.

More particularly, embodiments of the invention are to provide a solar cell panel and a method for manufacturing the solar cell panel being able to reduce a material cost without significantly increasing an amount of a sealing member and reduce a process time of a lamination process, and to effectively prevent a damage of a solar cell or a cover member during a lamination process. In addition, embodiments of the invention are to provide a solar cell panel and a method for manufacturing a solar cell panel being able to have a sufficient thickness and achieve a wanted sealing property at an edge portion of the solar cell panel in consideration of flow or leakage of a sealing member that may occur at the edge portion of the solar cell panel in a lamination process.

A solar cell panel according to an embodiment of the invention includes a sealing member for sealing a solar cell. The sealing member has a central region and an outer region positioned outside the central region, and the outer region includes a reinforcing region having a thickness greater than a thickness of the central region. Alternatively, an encapsulant for surrounding the solar cell has a central region and an outer region positioned outside the central region, and the outer region includes a thick region having a thickness greater than a thickness of the central region. In this instance, the sealing member includes a first sealing member positioned on a surface of the solar cell and a second sealing member positioned on the other surface of the solar cell. In the embodiment, a first cover member positioned on the first sealing member may include a glass substrate, and a second cover member positioned on the second sealing member may include a glass substrate.

In the embodiment, the outer region may further include an edge region positioned outside the reinforcing region and having an edge, and the edge region may have a thickness smaller than that of the reinforcing region. For example, a thickness of the edge of the sealing member may be the same as or less than the thickness of the central region. The thickness of the reinforcing region may be greater than the thickness of the central region by 30 um or more, or a ratio of a difference between the thickness of the reinforcing region and the thickness of the center region to the thickness of the central region may be 10% or more.

In the embodiment, the solar cell may include a plurality of solar cells including an outer solar cell positioned at an outer side and an inner solar cell positioned at the inner side of the outer solar cell. The reinforcing region may overlap at least a part of the outer solar cell, and the reinforcing region may be positioned not to overlap the inner solar cell.

The reinforcing region may include a portion gradually increasing in thickness toward an edge of the outer solar cell. The edge region may gradually decrease in thickness toward an edge of the solar cell panel.

According to this, the solar cell panel may include an outer area positioned outside a central area and including a reinforcing area having a thickness greater than a thickness of the central area. The outer area of the solar cell panel may further include an edge area positioned outside the reinforcing area and having an edge, and the edge area has a thickness smaller than the thickness of the reinforcing area.

The central region has an area greater than each of areas of the reinforcing region and the outer region.

For example, the solar cell may include a plurality of solar cells electrically connected in one direction to form a solar cell string, and the outer region or the reinforcing region comprises outer regions or reinforcing regions extending in the one direction at both edges in another direction crossing the one direction, respectively. However, embodiments of the invention are not limited thereto, and the outer region or the reinforcing region may be formed in a different direction or may be formed at a different position.

The solar cell may include a plurality of solar cells connected in one direction by a plurality of wiring members. A width of the plurality of wiring members may be 250 μm to 500 μm, or the plurality of wiring members may have a circular shape or a rounded portion. A number of the plurality of wiring members may be 6 to 33.

In a method of manufacturing a solar cell panel according to an embodiment of the invention, a laminated structure is formed by laminating a solar cell, a first sealing member, a second sealing member, a first cover member, and a second cover member, and a lamination process is performed by applying heat and pressure to the laminated structure. In this instance, at least one of the first sealing member and the second sealing member includes a base portion, and a reinforcing portion positioned on the base portion and having an overlapped portion overlapping at least a part of the solar cell. Alternatively, an encapsulant for sealing the solar cell includes a central portion, and a thick portion positioned at an outer side of the central portion and having a thickness of the thick portion greater than a thickness of the central portion. Accordingly, at least one of the first sealing member and the second sealing member is formed of a reinforcing sealing member. In the reinforcing sealing member, a first area or the central portion includes the base portion, a second area or the thick portion includes the base portion and the reinforcing portion, a thickness of the second area or the thick portion is greater than a thickness of the first area or the central portion. In this instance, the first sealing member and the first cover member are positioned on a surface of the solar cell, and the second sealing member and the second cover member are positioned on the other surface of the solar cell. In the embodiment, the first cover member may include a glass substrate, and the second cover member may include a glass substrate.

Thus, after the lamination process, a sealing member positioned between the first cover member and the second cover member may have a central region and an outer region positioned outside the central region, and the outer region may include a reinforcing region having a thickness greater than a thickness of the central region. Alternatively, the solar cell panel may include an outer area positioned outside a central area and including a reinforcing area having a thickness greater than a thickness of the central area.

For example, a ratio of a width of the overlapped portion to a width of the solar cell may be 10% or more, or a width of the reinforcing portion may be 5 cm or more.

The first area of the reinforcing sealing member may have an area greater than an area the second area of the reinforcing sealing member. The reinforcing portion of the reinforcing sealing member may be positioned at least at an edge portion or a corner portion of the solar cell panel.

The base portion may have a first thickness, the reinforcing portion may have a second thickness smaller than the first thickness.

In the embodiment, the base portion and the reinforcing portion of the reinforcing sealing member may be formed of the same material so that the reinforcing sealing member has a single body. Alternatively, the reinforcing portion of the reinforcing sealing member may have a material different from that of the base portion of the reinforcing sealing member, be separately formed from the base portion of the reinforcing sealing member, and be attached to or positioned on the base portion of the reinforcing sealing member. In the reinforcing sealing member, the base portion and the reinforcing portion may be formed of different materials, and the reinforcing portion may have lower hardness and higher elasticity than the base portion.

According to the embodiment, a sealing member includes a reinforcing region positioned at an edge portion of a solar cell panel and having a thickness greater than that of a central region, a thickness decrease of the sealing member that may occur at the edge portion of the solar cell panel can be prevented. Accordingly, the solar cell panel can have an excellent sealing property as a whole, and damage to a solar cell and a cover member, which may occur in a portion where pressure is concentrated during a lamination process, can be prevented. As a result, reliability of the solar cell panel can be improved and a defect rate in manufacturing the solar cell panel can be reduced.

A process time of the lamination process can be effectively shortened because the lamination process can be performed at a high temperature and/or a sufficient pressure by a reinforcing portion. On the other hand, a central region of the sealing member, in which relatively small pressure is applied during the lamination process, has a relatively small thickness, and thus, a material cost of the sealing member can be minimized. As a result, productivity in manufacturing the solar cell panel can be greatly enhanced.

DETAILED DESCRIPTION OF THE EMBODIMENTS

Figure 1:
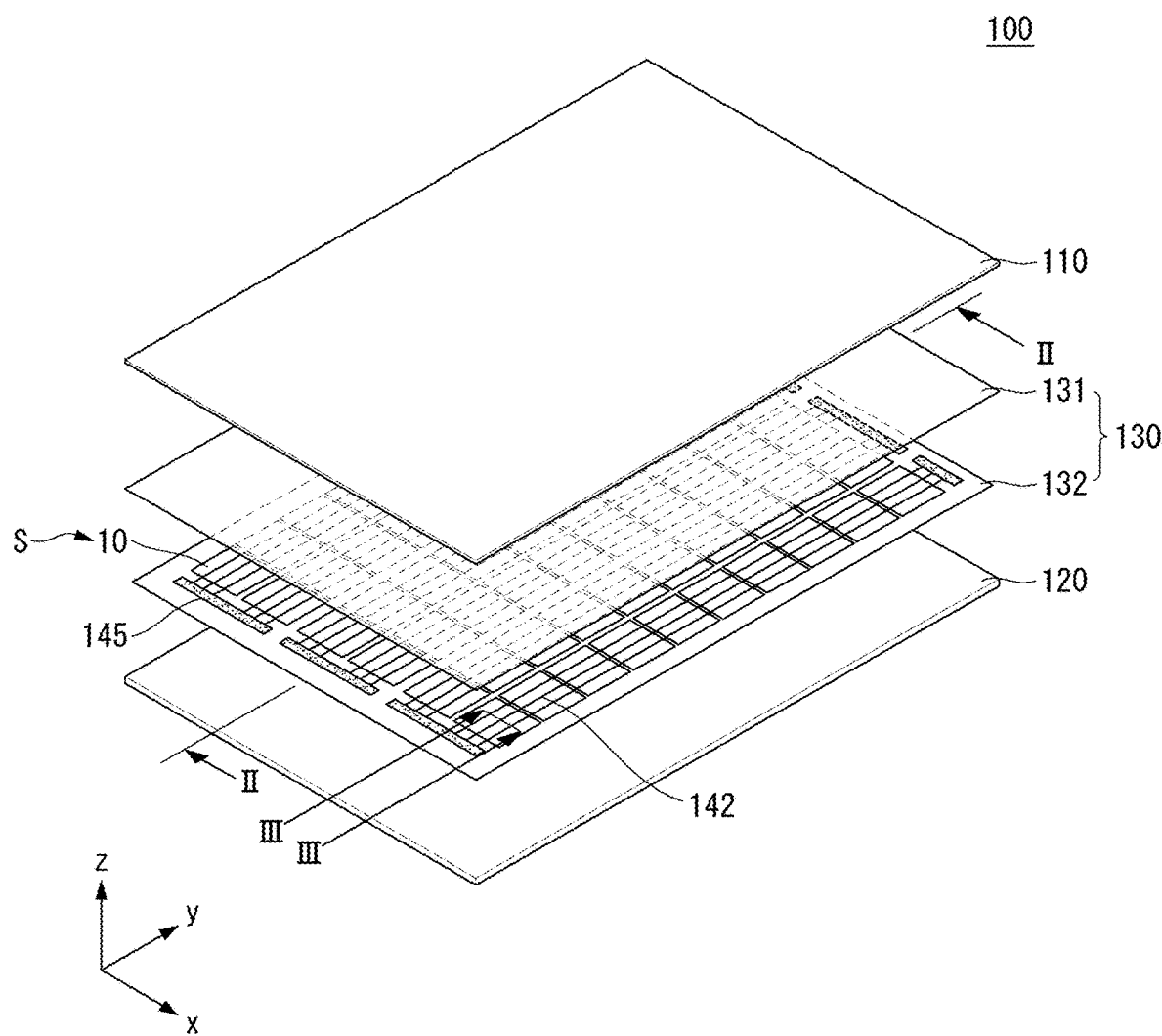
FIG. 1 is a perspective view schematically showing a solar cell panel according to an embodiment of the invention.

Reference will now be made in detail to various embodiments of the invention, examples of which are illustrated in accompanying drawings. The invention may, however, be embodied in many alternate forms and should not be construed as limited to the embodiments set forth herein.

In the drawings, illustration of parts unrelated to embodiments of the invention is omitted for clarity and simplicity of description. The same reference numerals designate the same or very similar elements throughout the specification. In the drawings, thicknesses, widths or the like of elements are exaggerated or reduced for clarity of description, and should not be construed as limited to those illustrated in the drawings.

It will be understood that the terms "comprise" and/or "comprising," or "include" and/or "including" used in the specification specify the presence of stated elements, but do not preclude the presence or addition of one or more other elements. In addition, it will be understood that, when an element such as a layer, film, region, or plate is referred to as being "on" another element, it may be directly disposed on another element or may be disposed such that an intervening element is also present therebetween. Accordingly, when an element such as a layer, film, region, or plate is disposed "directly on" another element, this means that there is no intervening element between the elements.

Figure 2:
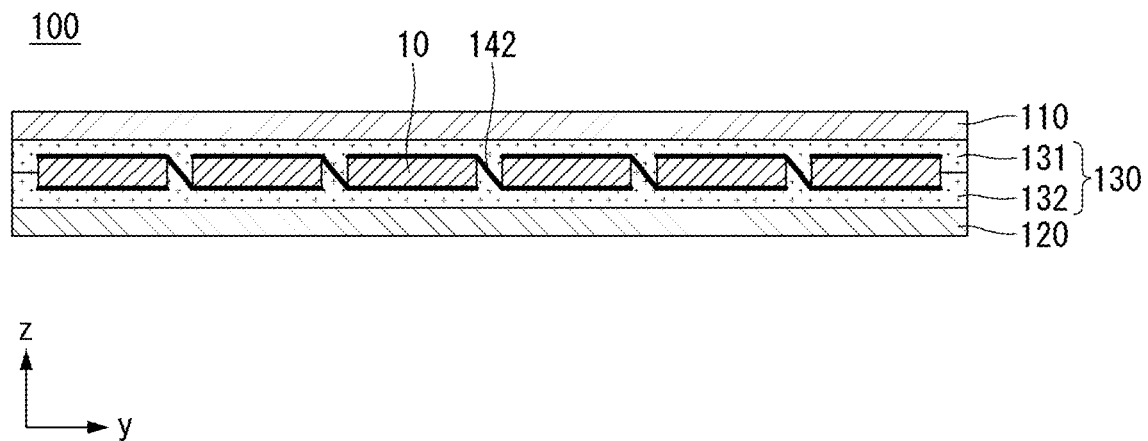
FIG. 2 is a schematic cross-sectional view taken along line II-II of FIG. 1.

FIG. 1 is a perspective view schematically showing a solar cell panel according to an embodiment of the invention, and FIG. 2 is a schematic cross-sectional view taken along line II-II of FIG. 1. Shapes of a sealing member 130 and a solar cell panel 100 including the sealing member 130 are schematically shown in FIGS. 1 and 2, and specific shapes thereof will be described later in detail with reference to FIG. 6.

Referring to FIGS. 1 and 2, a solar cell panel 100 according to an embodiment includes a solar cell 10, a sealing member 130 for sealing the solar cell 10, a first cover member 110, and a second cover member 120. The sealing member 130 includes a first sealing member 131 positioned on a surface of the solar cell 10 and a second sealing member 132 positioned on the other surface of the solar cell 10. The first cover member 110 is positioned on the first sealing member 131 and includes a glass substrate; and the second cover member 120 is positioned on the second sealing member 132 and includes a glass substrate. In this instance, the sealing member 130 has a central region CA (see FIG. 6) and an outer region EA (see FIG. 6) positioned outside the central region CA. The outer region EA includes a reinforcing region EA1 (see FIG. 6) having a thickness greater than a thickness of the central region CA. This will be explained in more detail.

In this instance, the solar cell 10 includes a photoelectric conversion portion in which electrons and holes are generated by light incidence, and electrodes 42 and 44 (see FIG. 3) that are electrically connected to the photoelectric conversion portion to collect electrons and holes. The photoelectric conversion portion and the electrodes 42 and 44 may have any of various structures. For example, the solar cell 10 may have a bi-facial structure. One example of the solar cell 10 that may be applied to the solar cell panel 100 according to the embodiment of the invention will be described later in detail with reference to FIGS. 3 and 4.

The first cover member 110 is disposed on the first sealing member 131 to constitute a front surface of the solar cell panel 100 and the second cover member 120 is disposed on the second sealing member 132 to constitute a back surface of the solar cell panel 100. Each of the first cover member 110 and the second cover member 120 may be formed of an insulating material capable of protecting the solar cell 10 from external shock, moisture, ultraviolet rays, or the like.

For example, each of the first cover member 110 and the second cover member 120 may be a glass substrate having excellent durability, insulation property, moisture resistance, light transmittance, and the like. Then, the glass substrates are placed on both sides of the solar cell panel 100, and can have excellent light transmittance at both sides, high durability due to high strength, excellent moisture resistance, ultraviolet ray property, or insulating property. Thus, the solar cell 10 can be protected physically and chemically stably.

In the embodiment, a plurality of solar cells 10 may be electrically connected in series, in parallel, or in series and parallel by an interconnector 142 and/or a bus ribbon 145. For example, a plurality of solar cells 10 may be connected to each other in a first direction (a y-axis direction in FIG. 1) by an interconnector 142 to constitute a solar cell string S consisting of one row, and a plurality of solar cell strings S may be positioned in a second direction (an x-axis direction in FIG. 1) crossing the first direction. The bus ribbons 145 are arranged at an end of the solar cell string S in a direction crossing the solar cell string S to connect the adjacent solar cell strings S or to connect the solar cell string S to a junction box (not shown) that prevents electricity from flowing backward. For example, bus ribbons 145 may be alternately connected to the interconnectors 142 at both ends of the solar cell strings S to connect the solar cell strings S in series. However, embodiments of the invention are not limited thereto, and the bus ribbon 145 may have any of various arrangements, connection structures, and the like.

Various shapes and shapes for connecting the solar cell 10 such as a ribbon, a wiring member, a wire, or the like may be applied to the interconnector 142 and/or the bus ribbon 145. In one example, interconnector 142 and/or bus ribbon 145 may be electrically and physically connected to solar cell 10 or interconnector 142 using a tabbing process using a solder material. Alternatively, the interconnector 142 and/or the bus ribbon 145 may be a conductive film formed of a conductive adhesive material. However, embodiments of the invention are not limited thereto. For example, the solar cell panel 100 may include only one solar cell 10, or a plurality of solar cells 10 may be electrically connected to each other by a connecting member other than the interconnector 142 and the bus ribbon 145.

For example, the interconnector 142 may connect a first electrode 42 disposed on a front surface of one solar cell 10 and a second electrode 44 disposed on a back surface of another solar cell 10 adjacent to the one solar cell 10. However, embodiments of the invention are not limited thereto, and neighboring solar cells 10 may be connected by another form or member.

The sealing member 130 may include a first sealing member 131 disposed on the front surfaces of the solar cells 10 electrically connected to each other and a second sealing member 132 disposed on the back surfaces of the solar cells 10 electrically connected to each other. It is exemplified that there is a predetermined boundary between the first sealing member 131 and the second sealing member 132 in FIG. 6. However, in a lamination process, the first sealing member 131 and the second sealing member 132 are integrated to form the sealing member 130, and thus, the boundary between the first sealing member 131 and the second sealing member 132 may be not clear.

The sealing member 130 prevents moisture and oxygen from flowing into the solar cell 10 and chemically combines elements of the solar cell panel 100. The sealing member 130 includes an insulating material having light transmittance and adhesive property as a base material. For example, the sealing member 130 may be formed of a material such as ethylene vinyl acetate resin (EVA), polyvinyl butyral (PVB), silicone resin, ester resin, olefin resin, polyethylene resin, ionomer, or so on. Particularly, the first sealing member 131 and the second sealing member 132 are formed of ethylene vinyl acetate, and then, excellent properties can be achieved even at a low material cost. However, embodiments of the invention are not limited thereto. Accordingly, the sealing member 130 may include any of various materials other than those described above, and may have any of various formed, types, or shapes.

In this instance, the first sealing member 131 and the second sealing member 132 may include different materials. For example, one of the first and second sealing members 131 and 132 may entirely include a material of different from a material of a part or all of the other of the first and second sealing members 131 and 132. Also, at least a part of one of the first and second sealing members 131 and 132 may include different from a material of a part or all of the other of the first and second sealing members 131 and 132. Various other variations are possible.

In the embodiment, as described above, the sealing member 130 may have a central region CA and an outer region EA. Hereinafter, an example of the solar cell 10 that can be included in the solar cell panel 100 according to the embodiment of the invention will be described with reference to FIGS. 3 and 4, and then, the sealing member 130 as described above will be described in detail.

Figure 3:
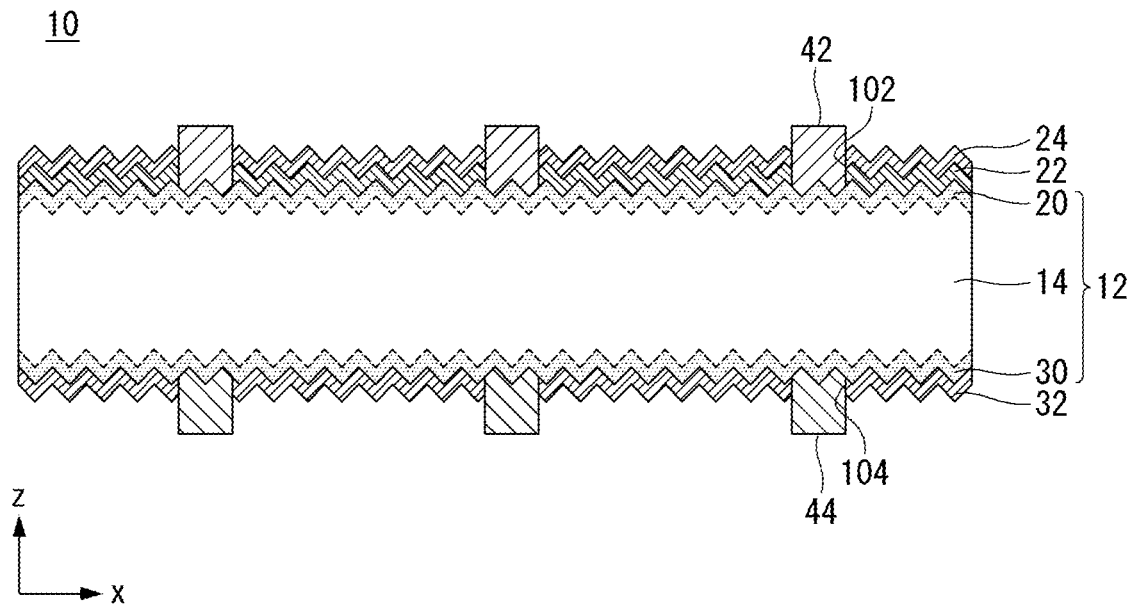
FIG. 3 is a cross-sectional view showing an example of a solar cell being able to be included in the solar cell panel shown in FIG. 1.
Figure 4:
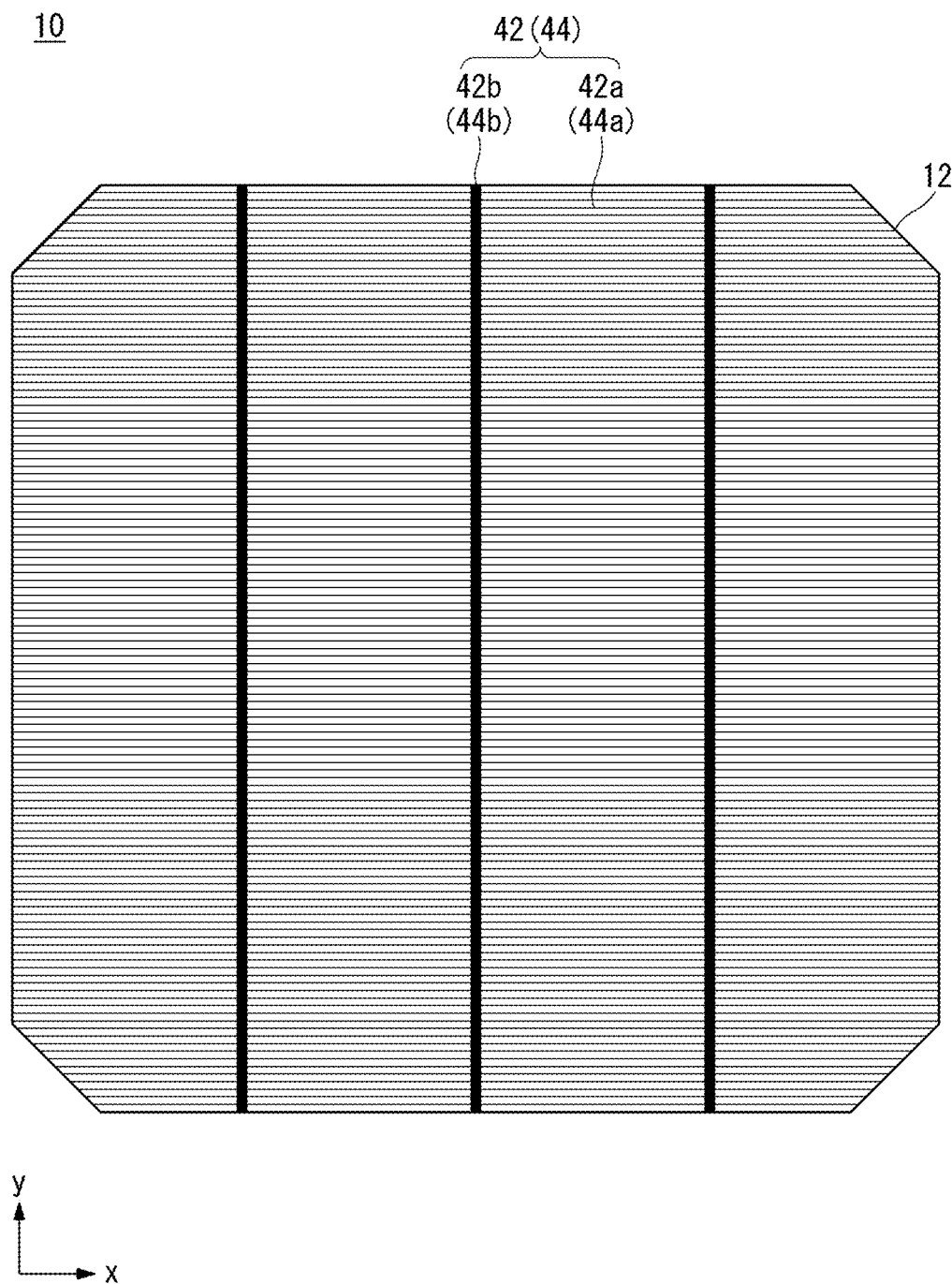
FIG. 4 is a plan view schematically showing the solar cell shown in FIG. 3.

FIG. 3 is a cross-sectional view showing an example of a solar cell 10 being able to be included in the solar cell panel 100 shown in FIG. 1, and FIG. 4 is a plan view schematically showing the solar cell 10 shown in FIG. 3. FIG. 3 is a cross-sectional view taken along line III-III in FIG. 1.

Referring to FIGS. 3 and 4, a solar cell 10 may include a semiconductor substrate 12 including a base region 14, a conductive region 20 or 30 on or at the semiconductor substrate 12, and an electrode 42 or 44 connected to the conductive region 20 or 30. The semiconductor substrate 12, the conductive region 20 or 30, or so on may constitute a photoelectric conversion portion involved in photoelectric conversion. The conductive region 20 or 30 may include a first conductive region 20 and a second conductive region 30 having different conductivity types and the electrode 42 or 44 may include a first electrode 42 connected to the first conductive region 20 and a second electrode 44 connected to the second conductive region 30. This will be explained in more detail.

The semiconductor substrate 12 may include a base region 14 including a first or second conductivity type dopant at a relatively low doping concentration to have a first or second conductivity type. A first conductive region 20 having a first conductivity type may be formed on a surface (for example, a front surface) of the semiconductor substrate 12. A second conductive region 30 having a second conductivity type may be formed on the other surface (for example, a back surface) of the semiconductor substrate 12. The first and second conductive regions 20 and 30 may have a different conductivity type than the base region 14 or may have a doping concentration higher than that of the base region 14.

In the embodiment, any of various materials which represent n-type or p-type may be used as the first or second conductivity type dopant. As the p-type dopant, boron (B), aluminum (Al), gallium (Ga), indium (In) or the like may be used. As the n-type dopant, phosphorus (P), arsenic (As), bismuth (Sb) or the like may be used. For example, the p-type dopant may be boron (B) and the n-type dopant may be phosphorus (P).

One of the first and second conductive regions 20 and 30 having a conductivity type different from that of the base region 14 constitutes at least a part of an emitter region. The emitter region forms a pn junction with the base region 14 to generate carriers by photoelectric conversion. The other of the first and second conductive regions 20 and 30 having the same conductivity type as the base region 14 constitutes at least a part of a surface field region. The electric field region forms an electric field that prevents carriers from being lost by recombination on or at a surface of the semiconductor substrate 12. For example, in the embodiment, the base region 14 has the second conductivity type, the first conductive region 20 constitutes the emitter region, and the second conductive region 30 constitutes the back electric field region. However, embodiments of the invention are not limited thereto.

The semiconductor substrate 12, or the base region 14, the first and second conductive regions 20 and 30 formed thereon, may be a crystalline semiconductor of a single material (e.g., a single-crystalline or polycrystalline semiconductor of a single material, as an example, a single-crystalline or polycrystalline silicon, particularly, a single-crystalline silicon). The solar cell 10 based on the base region 14 or the semiconductor substrate 12 having a high degree of crystallinity and having few defects is excellent in electrical property. An anti-reflection structure (for example, a texturing structure having a pyramid shape or the like) capable of minimizing reflection may be formed at a front surface and/or a back surface of the semiconductor substrate 12.

In the embodiment, each of the first and second conductive regions 20 and 30 may be formed of a doped region constituting a part of the semiconductor substrate 12. As another example, at least one of the first and second conductive regions 20 and 30 may be formed separately from the semiconductor substrate 12 on the semiconductor substrate 12. In this instance, the first or second conductive region 20 or 30 may be formed of an amorphous semiconductor layer, a microcrystalline semiconductor layer, or a polycrystalline semiconductor layer (for example, an amorphous silicon layer, a microcrystalline silicon layer, or a polycrystalline silicon layer). In this instance, a separate layer (a tunneling layer, a passivation layer, etc.) may be formed between the first or second conductive region 20 or 30 and the semiconductor substrate 12.

A first passivation layer 22 and/or an anti-reflection layer 24, which is a first insulating layer, may be positioned at least on the front surface of the semiconductor substrate 12 (more particularly, on the first conductive region 20 formed at the front surface of the semiconductor substrate 12). A second passivation layer 32, which is a second insulating layer, may be positioned at least on the back surface of the semiconductor substrate 12 (more particularly, on the second conductive region 30 formed at the front surface of the semiconductor substrate 12).

The first passivation layer 22, the anti-reflection layer 24, and the second passivation film 32 may be formed substantially on an entire portion of the semiconductor substrate 12 except for openings 102 and 104. For example, the first passivation layer 22, the anti-reflection layer 24, or the second passivation film 32 may be a single-layered structure or a multi-layered structure in which two or more films are combined. The single-layered structure or the multi-layered structure includes at least one layer of a silicon nitride layer, a silicon nitride layer including hydrogen, a silicon oxide layer, a silicon oxynitride layer, an aluminum oxide layer, a silicon carbide layer, ZnS, $TiO_2$, and $CeO_2$. For example, the first passivation layer 22 and/or the anti-reflection layer 24, and the second passivation film 32 may not include a dopant or the like so as to have excellent insulating properties, passivation properties, and the like. However, embodiments of the invention are not limited thereto.

The first electrode 42 may fill at least a portion of the first opening 102 and be electrically connected to (for example, in contact with) the first conductive region 20, and the second electrode 44 may fill at least a portion of the second opening 104 and be electrically connected to (for example, in contact with) the second conductive region 30. The first and second electrodes 42 and 44 are formed of any of various conductive materials (for example, a metal) and may have any of various shapes.

For example, when the first and second electrodes 42 and 44 may include at least of silver (Ag), aluminum (Al), gold (Au), titanium (Ti), tungsten (W), or copper (Cu) as a conductive material. In this instance, the first and second electrodes 42 and 44 may be formed by any of various methods. As an example, at least one of the first and second electrodes 42 and 44 may be manufactured by printing, plating, sputtering or the like. The first and second electrodes 42 and 44 may be formed by any of various other methods. The first electrodes 42 may include a plurality of finger electrodes 42a spaced apart from each other with a predetermined pitch and formed in one direction. Although the finger electrodes 42a are parallel to each other and parallel to an edge of the semiconductor substrate 12 in FIG. 4, embodiments of the invention are not limited thereto. The first electrode 42 may include a bus bar electrode 42b formed in a direction crossing (for example, perpendicular to) the finger electrodes 42a and connecting the finger electrodes 42a. Interconnectors 142 may be attached to the bus bar electrodes 42b, respectively. Only one bus bar electrode 42b may be provided or a plurality of bus bar electrodes 42b may be provided with a larger pitch than the pitch of the finger electrodes 42a as shown in FIG. 4. In this instance, a width of the bus bar electrode 42b may be greater than a width of the finger electrode 42a, but embodiments of the invention are not limited thereto. Therefore, a width of the bus bar electrode 42b may be the same as or smaller than a width of the finger electrode 42a.

The second electrode 44 may include a finger electrode 44a and a bus bar electrode 44b corresponding to the finger electrode 42a and the bus bar electrode 42b of the first electrode 42, respectively. The description of the finger electrode 42a and the bus bar electrode 42b of the first electrode 42 may be directly applied to the finger electrode 44a and the bus bar electrode 44b of the second electrode 44. A width, a pitch, or the like of the finger electrode 42a of the first electrode 42 may be the same as or different from a width, a pitch, or the like of the finger electrode 44a of the second electrode 44. The width of the bus bar electrode 42b of the first electrode 42 may be the same as or different from the width of the bus bar electrode 44b of the second electrode 44. The bus bar electrode 42b and the bus bar electrode 44b of the second electrode 44 may be arranged so as to have the same pitch at the same position.

As described above, in the embodiment, the first and second electrodes 42 and 44 are partially formed to have a certain pattern. Accordingly, light can be incident on a portion where the first and second electrodes 42 and 44 are not formed. The solar cell 10 has a bi-facial structure in which light can be incident on the front surface and the back surface of the semiconductor substrate 12. However, embodiments of the invention are not limited to shapes of the first and second electrodes 42 and 44, and may have any of various shapes. Although the bi-facial structure is shown in FIG. 3, the second electrode 44 may be formed entirely on the back surface of the semiconductor substrate 12.

Hereinafter, the sealing member 130 and the first and second cover members 110 and 120 of the solar cell panel 100 according to the embodiment of the invention will be described in detail with reference to FIGS. 5 to 7.

Figure 5:
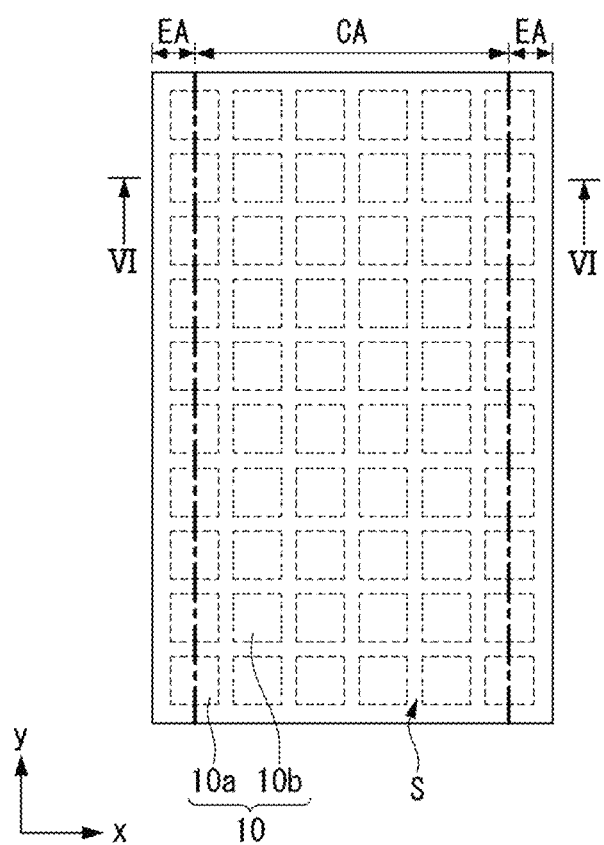
FIG. 5 is a plan view schematically showing a solar cell panel according to an embodiment of the invention.
Figure 6:
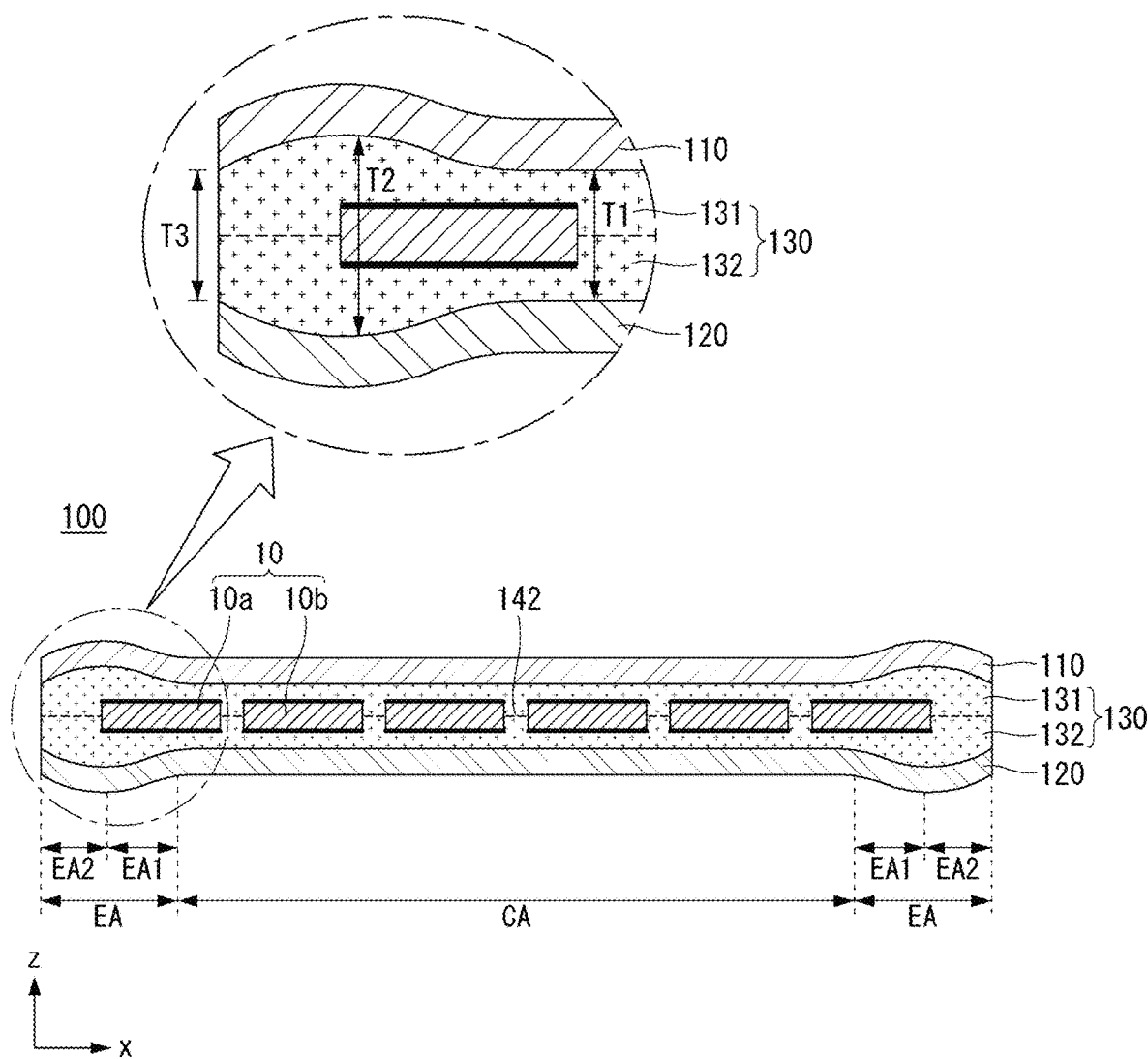
FIG. 6 is a cross-sectional view taken along line VI-VI of FIG. 5.

FIG. 5 is a plan view schematically showing a solar cell panel 100 according to an embodiment of the invention, and FIG. 6 is a cross-sectional view taken along line VI-VI of FIG. 5. For a clear understanding and a simplified illustration, solar cells 10, and a central region CA and an outer region EA of a sealing member 130 are mainly shown in FIG. 5.

With reference to FIGS. 5 and 6, in the embodiment, a sealing member 130 has a central region CA and an outer region EA positioned outside the central region CA. The outer region EA includes a reinforcing region EA1 having a thickness greater than that of the central region CA. Accordingly, the solar cell panel 100 may include an outer area positioned outside a central area and including a reinforcing area having a thickness greater than that of the central area. In this instance, the thickness of the sealing member 130 is defined as a distance between the first cover member 110 and the second cover member 120 (i.e., a distance between an inner surface of the first cover member 110 and an inner surface of the second cover member 120). The thickness of the solar cell panel 100 may be defined as a distance between an outer surface of the first cover member 110 and an outer surface of the second cover member 120.

The central region CA is a region including a center of the solar cell panel 100 and connected to the center. The central region CA is defined as a region having a thickness substantially the same as a first thickness T1 of the sealing member 130 at the center of the solar cell panel 100. In one example, a difference between a thickness of the central region CA and the first thickness T1 of the sealing member 130 at the center of the solar cell panel 100 may be less than 30 um, or a difference between a thickness of the central region CA and the first thickness T1 of the sealing member 130 at the center of the solar cell panel 100 may be less than 10% of the first thickness T1. This difference is a difference that may be induced by a difference in thickness due to the sealing member 130 itself, an error in an apparatus for measuring a thickness of the sealing member 130, or the like. The central region CA may be positioned so as to include a portion where an inner solar cell or inner solar cells 10b among a plurality of solar cells 10 other than an outer solar cell 10a positioned adjacent to an outer portion of the solar cell panel 100 are positioned. In this specification, the outer solar cell 10a may refer to the outermost solar cell closest to an edge of the solar cell panel 100. The outer region EA is a region including at least a part of an edge of the solar cell panel 100. In the embodiment, the outer region EA may include a reinforcing region EA1 having a thickness greater than the first thickness T1 of the central region CA. The reinforcing region EA1 or the outer region EA may be positioned adjacent to an outer portion of the solar cell panel 100 while overlapping at least a part of the outer solar cell 10a.

When the sealing member 130 is formed to have a reinforcing region EA1 having a relatively large thickness to be adjacent to the outer portion, it is possible to minimize or prevent a decrease of a thickness of the sealing member 130 near the edge portion of the solar cell panel 100 due to outflow or leakage of the sealing member 130 in a lamination process (see FIG. 8B) of a method for manufacturing the solar cell panel. Accordingly, the sealing member 130 at the edge portion of the solar cell panel 100 may have a thickness that can maintain a minimum sealing property. In addition, it is possible to prevent damage of the solar cell 10, the first or second cover member 110 or 120, which may occur at edge or corner portions of the solar cell panel 100. Particularly, in the solar cell panel 100 in which the first cover member 110 and the second cover member 120 each include a glass substrate, it can be effectively prevented that the sealing property is largely lowered and that the glass substrate constituting the first or second cover member 110 or 120 is broken at the edge or corner portion, which may be generated because the pressure is concentrated on the edge or corner portion of the solar cell panel 100 during the lamination process.

On the other hand, in the conventional art, pressure is concentrated on the edge or corner portion of the solar cell panel 100 during the lamination process, the sealing property may be largely lowered and the first or second cover member 110 or 120 may be damaged at the edge or corner portion during the lamination process. These problems may occur more seriously when the first cover member 110 and the second cover member 120 each include a glass substrate.

In this instance, even if a part of a sealing member 130 (for example, an edge or corner portion of the sealing member 130) has a relatively large thickness before a lamination process, the thickness of the sealing member 130 at the edge or corner portion may become the same as or smaller than a thickness of the sealing member 130 at other portions during the lamination process or after the lamination process due to heat and pressure applied in the lamination process. Thus, even if the sealing member 130 is thick in some areas, if the solar cell panel 100 does not have the reinforcing region EA1 after the lamination process, it is difficult to shock-absorb the pressure applied to the first or second cover member 110 or 120, or to prevent the sealing member 130 from flowing or leaking out to an outside, which may be induced at the edge or corner portion. Accordingly, in the embodiment, the sealing member 130 (more particularly, a reinforcing portion 132b) has a sufficient thickness so that the reinforcing region EA1 having a relatively thick thickness remains at an outer side of the sealing member 130 even after the lamination process. Then, the sealing member 130 at the edge or corner portion of the solar cell panel 100 has a thickness of a certain level or more and thus a sealing property can be improved even if the sealing member 130 flows out at the edge or corner portion of the solar cell panel 100. In addition, due to the reinforcing region EA1 which remained after the lamination process, a portion having a thick thickness in the lamination process can effectively absorb shock. Thus, it is possible to effectively prevent the damage or the breakage of the glass substrate constituting the first or second cover member 110 or 120 in the lamination process.

In contrast, if an auxiliary sealing film or the like having a thickness for removing bubbles is further provided, it is difficult to solve a problem that a thickness of a sealing member at an edge portion becomes smaller than the desired thickness due to an outflow of the sealing member at the edge portion.

In one example, in the embodiment, the outer region EA has the reinforcing region EA1, and an edge region EA2 positioned outside the reinforcing region EA1. The edge region EA2 has an edge having a thickness smaller than a thickness of a second thickness T2, which is a maximum thickness of the reinforcing region EA1. In this instance, the reinforcing region EA1 may be positioned to overlap at least a part of the outer solar cell 10a. In this instance, the reinforcing region EA1 may include a portion where a thickness of the sealing member 130 gradually increases toward an edge of the outer solar cell 10a adjacent to the edge of the solar cell panel 100. In the edge region EA2, a thickness of the sealing member 130 may gradually decrease toward the edge of the solar cell panel 100. For example, the reinforcing region EA1 may be defined as a portion where a thickness of the sealing member 130 gradually increases from the first thickness T1 to the second thickness T2 which is the maximum thickness, and the edge region EA2 may be defined as a portion where a thickness of the sealing member 130 gradually decreases from the second thickness T2, which is the maximum thickness, to the third thickness T3, which is a thickness of the sealing member 130 at the edge of the solar cell panel 100.

In the embodiment, each of the first and second cover members 110 and 120 has a uniform thickness (for example, a thickness within 10% difference or tolerance, for example, within 5% difference or tolerance), and thus, a thickness shape of the solar cell panel 100 is substantially the same as or similar to a thickness shape of the sealing member 130. Accordingly, the solar cell panel 100 may has a central area having substantially the same thickness, and an outer area positioned outside the central area and including a reinforcing area having a thickness greater than that of the central area. In this instance, the outer area may further include an edge area including an edge having a thickness smaller than the maximum thickness of the reinforcing area. In this instance, the reinforcing area may include a portion gradually increasing in thickness from the central area toward the outside of the solar cell panel 100. In the edge area, a thickness of the solar cell panel 100 may gradually decrease toward the edge of the solar cell panel 100. For example, a the thickness of the solar cell panel 100 gradually increases toward the edge of the outer solar cell 10a at the reinforcing portion, reaches the maximum thickness, and gradually decreases toward the edge of the solar cell panel 100.

In this instance, the second thickness T2 of the reinforcing region EA1 may be greater than the first thickness T1 of the central region CA by 30 um or more (more specifically, 30 um to 500 um). For example, the second thickness T2 of the reinforcing region EA1 may be greater than the first thickness T1 of the central region CA by 60 um or more (more specifically, 60 um to 300 um). Alternatively, a ratio of a difference between the second thickness T2 of the reinforcing region EA1 and the first thickness T1 of the center region CA to the first thickness T1 of the central region CA may be 10% or more (for example, 10% to 35%). Such a thickness difference is sufficient to realize the effect of the reinforcing region EA1 while reducing a material cost. If the difference between the first thickness T1 and the second thickness T2 is too large (for example, exceeds 500 um), a structural stability of the solar cell panel 100 may deteriorate. However, embodiments of the invention are not limited thereto, and the thickness of the reinforcing region EA1 may be variously modified.

In the embodiment, for example, the third thickness T3, which is the thickness of the sealing member 130 at the edge of the solar cell panel 100, may be smaller than the second thickness T2, and may be the same as or smaller than the first thickness T1. More particularly, the third thickness T3 of the sealing member 130 may be less than the first thickness T1. The third thickness T3 of the sealing member 130 may be decreased due to the flow or leak out of the sealing member 130 at the edge portion even when the reinforcing region EA1 is provided. If a lamination apparatus is entirely changed or an additional member is used in order to prevent this, a manufacturing process may become complicated and a productivity may be lowered. In the embodiment, even in the above structure, a ratio of the third thickness T3 to the first thickness T1 may be 80% or more (for example, 90% or more). This is because the third thickness T3 is prevented from becoming excessively smaller than the first thickness T1 by the reinforcing region EA1.

A width of the edge region EA2 may be larger than a width of the reinforcing region EA1 in a direction from a center to an edge of the solar cell panel 100. Then, a thickness of the sealing member 130 in the edge region EA2 is gradually reduced, thereby improving a structural stability. However, embodiments of the invention are not limited thereto, and thus, a width of the reinforcing region EA1 may be the same as or greater than a width of the edge region EA2. In the direction from the center to the edge of the solar cell panel 100, a degree to which a thickness increases in the reinforcing region EA1 (that is, an absolute value of gradient or slope) may be the same as, greater than, or smaller than a degree to which a thickness decreases in the edge region EA2 (that is, an absolute value of gradient or slope). For example, the degree to which the thickness increases in the reinforcing region EA1 (that is, the absolute value of gradient or slope) may be greater than the degree to which the thickness decreases in the edge region EA2 (that is, the absolute value of gradient or slope). Then, the thickness of the sealing member 130 in the edge region EA2 is gradually reduced, thereby improving a structural stability. However, embodiments of the invention are not limited thereto and thus various modifications are possible.

As an example, a portion of the sealing member 130 having the second thickness T2 of the maximum thickness may be positioned adjacent to an edge or an outer boundary of the outer solar cell 10a. That is, the portion of the sealing member 130 having the second thickness T2 of the maximum thickness is positioned within 20% of a length (e.g., a maximum length) of the outer solar cell 10a from the outer boundary of the outer solar cell 10a. However, embodiments of the invention are not limited thereto. The position of the portion of the sealing member 130 having the second thickness T2 of the maximum thickness may be aligned or coincident with the outer boundary of the outer solar cell 10a, may be positioned inside the outer boundary of the outer solar cell 10a, or may be positioned outside the outer boundary of the outer solar cell 10a. Various other variations are possible.

It is exemplified that boundaries of the central area, the reinforcing area, and the edge area of the solar cell panel 100 may be aligned or coincident with boundaries of the central region CA, the reinforcing region EA1, and the edge region EA2 of the sealing member 130, respectively. However, embodiments of the invention are not limited thereto. Therefore, a shape or a difference in the thickness of the sealing member 130 may be not directly reflected to the first and second cover members 110 and 120, and thus, the boundary of the central area, the reinforcing area, or the edge area of the solar cell panel 100 may be slightly different from the boundary of the central region CA, the reinforcing region EA1, or the edge region EA2 of the sealing member 130.

In the embodiment, the central region CA may have an area larger than that of each of the outer region EA, the reinforcing region EA1, and the edge region EA2. That is, a ratio of an area of the outer region EA to a total area of the solar cell panel 100 or the sealing member 130 may be less than 50%. More particularly, the outer region EA or the reinforcing region EA1 may be positioned so as to overlap at least a part of the outer solar cell 10a, but not overlap with the inner solar cell 10b. The area of the outer region EA or the reinforcing region EA1 can be reduced and thus a material cost of the sealing member 130 can be reduced. However, embodiments of the invention are not limited thereto.

For example, as shown in FIG. 5, the solar cell string S extends in a first direction (a y-axis in FIG. 5), and the outer region EA (or the reinforcing region EA1 included therein) includes outer regions EA positioned at both sides of a second direction (an x-axis direction in FIG. 5) crossing the first direction and having a shape extending in the first direction. Since the bus ribbons 145 (see FIG. 1) are positioned at both ends (i.e., both ends in the first direction) of the solar cell string S, phenomena such as damage or breakage of the first or second cover member 110 or 120, the solar cell 10, or so on may be not severe even when pressure is applied during the lamination process. On the other, because the bus ribbons 145 and the like are not positioned at both sides in the second direction, the first or second cover member 110 or 120, the solar cell 10, or so on may be relatively easily damaged or broken by the pressure during the lamination process. In consideration of this, in the embodiment, the outer region EA is positioned at both sides in the second direction, thereby effectively preventing damage or breakage of the first or second cover member 110 or 120, or the solar cell 10, or so on due to pressure. In this instance, since the outer region EA has a shape extending in parallel to the solar cell string S or in a long axis direction, a small number of reinforcing portions 132b can have a sufficient area and effectively reinforce the portions where pressure is concentrated. In addition, the outer region EA is not positioned in the direction crossing the solar cell string S or the short axis direction, thereby reducing a material cost. In this instance, a thickness of the sealing member 130 or the solar cell panel 100 in at least a part of the outer region EA or the outer area (for example, the reinforcing region EA1 or the reinforcing area) may be greater than a thickness of the sealing member 130 or the solar cell panel 100 in the central region CA or the central area. In contrast, if the reinforcing portions are positioned at both ends in a longitudinal direction of the solar cell panel 100, it may be difficult to solve a thickness reduction problem of the sealing material 130 that may occur along a longitudinal direction of the solar cell panel 100.

However, embodiments of the invention are not limited thereto, and an outer region EA may be positioned at least at an edge or corner portion of a solar cell panel 100. As a modified embodiment, for example, as shown in FIG. 7(a), an outer region EA may have a shape extending in a direction crossing the solar cell string S or in a short axis direction. In this instance, in the first direction, a thickness of a sealing member 130 or a solar cell panel 100 in at least a part of an outer region EA or an outer area may be greater than a thickness of the sealing member 130 or the solar cell panel 100 in the central region CA or the central area. Then, it is possible to reduce an area of the outer region EA, thereby reducing a material cost. As another example, as shown in FIG. 7(b), an outer region EA has a frame shape extending continuously along entire edges of a solar cell panel 100 to maximize effect by the outer region EA. In this instance, in each of the first direction and the second direction, a thickness of a sealing member 130 or a solar cell panel 100 in at least a part of an outer region EA or an outer area may be greater than a thickness of the sealing member 130 or the solar cell panel 100 in the central region CA or the central area. As another example, as shown in FIG. 7(c), outer regions EA may be partially positioned at four corners of the solar cell panel 100, respectively. According to this, the area of the outer regions EA can be minimized. In this instance, in a direction at a portion adjacent to the corner, a thickness of a sealing member 130 or a solar cell panel 100 in at least a part of an outer region EA or an outer area may be greater than a thickness of the sealing member 130 or the solar cell panel 100 in the central region CA or the central area. As still another example, as shown in FIG. 7(d), outer regions EA may be positioned in plural in a direction parallel to a solar cell string S or in a long axis direction. The outer region EA may have any of various other planar shapes.

A thickness difference between the central region CA and the outer region EA (more particularly, the reinforcing region EA1) of the sealing member 130 may be induced when at least one of the first and second sealing members 131 and 132 is formed of a reinforcing sealing member. In this instance, the reinforcing sealing member means a sealing member which is formed of a base portion 132a (see FIG. 8A) and a reinforcing portion 132b (see FIG. 8A) positioned on the base portion 132a and having an overlapped portion OP overlapping a part of the solar cell 10. The reinforcing sealing member will be described later in more detail with reference to FIGS. 8A to 8C, 9, 10 and 11. When the reinforcing sealing member is provided with the reinforcing portion 132b, even if the reinforcing sealing member is pressed by the pressure during the lamination process, a portion having a relatively larger thickness than the other portions remains. Thus, the reinforcing region EA1 may remain at a portion corresponding to the reinforcing portion 132b. The phrase that that the reinforcing region EA1 remains at a portion corresponding to the reinforcing portion 132b means not only the reinforcing portion 132b and the reinforcing region EA1 are completely matched but also the reinforcing region EA1 is positioned so as to overlap at least a part of the reinforcing portion 132b. For example, the reinforcing region EA1 may be formed in a region smaller than the reinforcing portion 132b, and may have a shape the same as or similar to that of the reinforcing portion 132b or a shape and/or an area different from that of the reinforcing portion 132b. Alternatively, the reinforcing region EA1 may be formed in a region the same as or greater than the reinforcing portion 132b, and may have a shape and/or an area the same as or similar to that of the reinforcing portion 132b or a shape and/or an area different from that of the reinforcing portion 132b. In this instance, at least a part of the reinforcing portion 132b moves inward, and the reinforcing region EA1 extends to the inside and the edge region EA2 may be positioned outside the reinforcing region EA1.

For example, in a method for manufacturing the solar cell panel 100, the second sealing member 132 to be positioned on an upper side or a side where pressure is applied in a staked process (see FIG. 8A) or a lamination process may be the reinforcing sealing member. With this structure, it is possible to maximize shock-absorbing effect by the reinforcing portion 132b or the reinforcing region EA1 during the lamination process. However, embodiments of the invention are not limited thereto. Therefore, the first sealing member 131 may be formed of a reinforcing sealing member, or each of the first and second sealing members 131 and 132 may be formed of a reinforcing sealing member. The reinforcing portion 132b may be formed at a surface of the first or second sealing member 131 or 132 facing the first or second cover member 110 or 120 or a surface opposite thereto, or both surfaces of the first or second sealing member 131 or 132. Various other variations are possible.

By the shape of the sealing member 130 described above, the first and/or second cover members 110 and/or 120 may have a shape having a bent, rounded, or inclined portion. For example, a portion having the second thickness T2 at the outer region EA (or the outer area) may have a shape of a protruding portion protruding toward the outside. For example, the reinforcing region EA1 (or the reinforcing area) and the edge region EA2 (or the edge area) may have a shape of at least a part of a Gaussian distribution. In this instance, the outer region EA has a shape of a protruding portion protruding toward the outside in a portion having the second thickness T2, and concave portions each having an inflection point at both sides of the protruding portion having the second thickness T2. However, embodiments of the invention are not limited thereto, and the outer region EA may have the shape of a protruding portion toward the outside as a whole.

For example, it is exemplified that the first and second cover members 110 and 120 have a symmetrical shape even when the second sealing member 132 is formed of a reinforcing sealing member in FIG. 6. This is because the pressure is kept below a certain level in the lamination process or the pressure is applied by air or the like, which can improve a structural stability. However, embodiments of the invention are not limited thereto. When the reinforcing portion 132b is included in one of the first and second sealing members 131 and 132, a first or second cover member 110 or 120 adjacent to the reinforcing portion 132b may have at least a bent, rounded, or inclined portion, while the first or second cover member 110 or 120 not adjacent to the reinforcing portion 132b may have a flat plate shape. Other variations are possible.

In this instance, the reinforcing portion 132b of the reinforcing sealing member may be formed of the same material as the base portion 132a. In this instance, the first or second sealing member 131 or 132 or the sealing member 130 may be formed of the same material without any boundaries to form an integral structure and a single body. The outer region EA or the reinforcing region EA1 may have the same material as the central region CA when viewed from one side (a front side or a back side) of the solar cell 10.

Alternatively, the reinforcing portion 132b may have a different material from the base portion 132a in the reinforcing sealing member. Then, when viewed from one side (a front side or a back side) of the solar cell 10, at least a part of the outer region EA or the reinforcing region EA1 may have a portion including a material different from a material of the central region CA. For example, a portion of the outer region EA or the reinforcing region EA1 having a material different from that of the central region CA may be formed of a material having lower hardness and higher elasticity than other portions. Then, shock-absorbing effect can be maximized by low hardness and high elasticity in the reinforcing region EA1. However, embodiments of the invention are not limited thereto. Accordingly, materials of the base portion 132a and the reinforcing portion 132b may be various. When the second sealing member 132 is provided with the reinforcing portion 132b as described above, at least a part of the portion formed of the different material in the sealing member 132 may be positioned at an outer portion between the solar cell 10 and the second cover member 120. However, embodiments of the invention are not limited thereto.

In this instance, when any one of the first and second sealing members 131 and 132 is formed of the reinforcing sealing member, the base portion 132a and the reinforcing portion 132b of the reinforcing sealing member may be formed of a material the same as or different from that of a part or an entire portion of the other of the first and second sealing members 131 and 132.

Hereinafter, a method for manufacturing a solar cell panel 100 will be described in detail, and a base portion 132a and a reinforcing portion 132b of a sealing member 130 and a first area A1 and a second area A2 of the sealing member 130 will be described in detail.

Figure 8A:
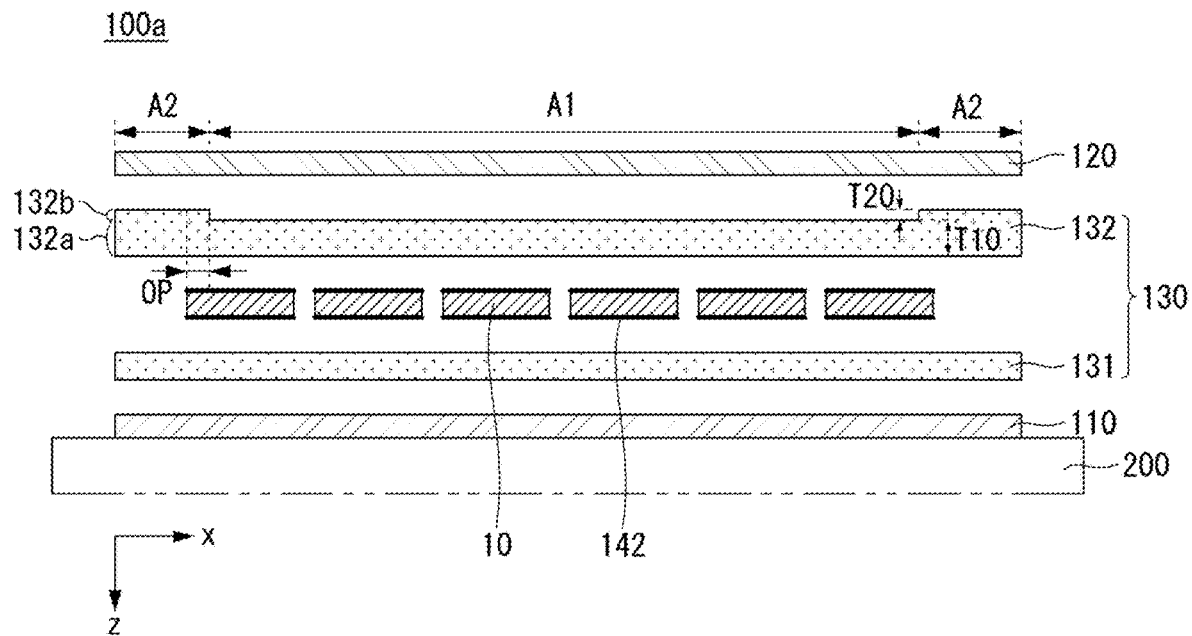
FIGS. 8A to 8C are views schematically showing a method for manufacturing a solar cell panel according to an embodiment of the invention.
Figure 8B:
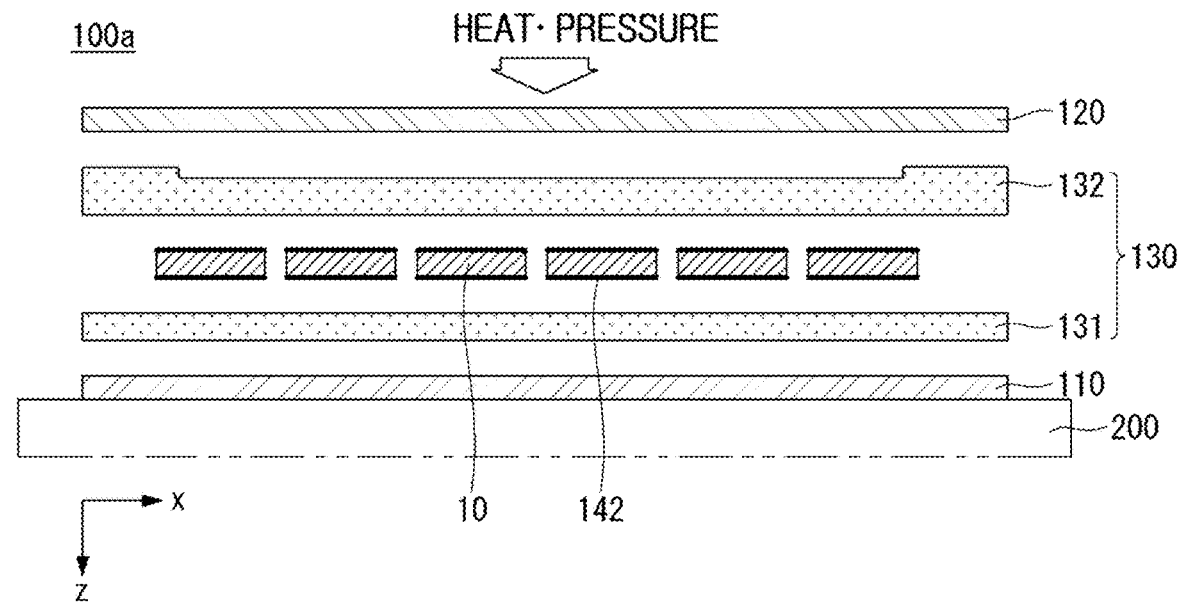
Figure 8C:
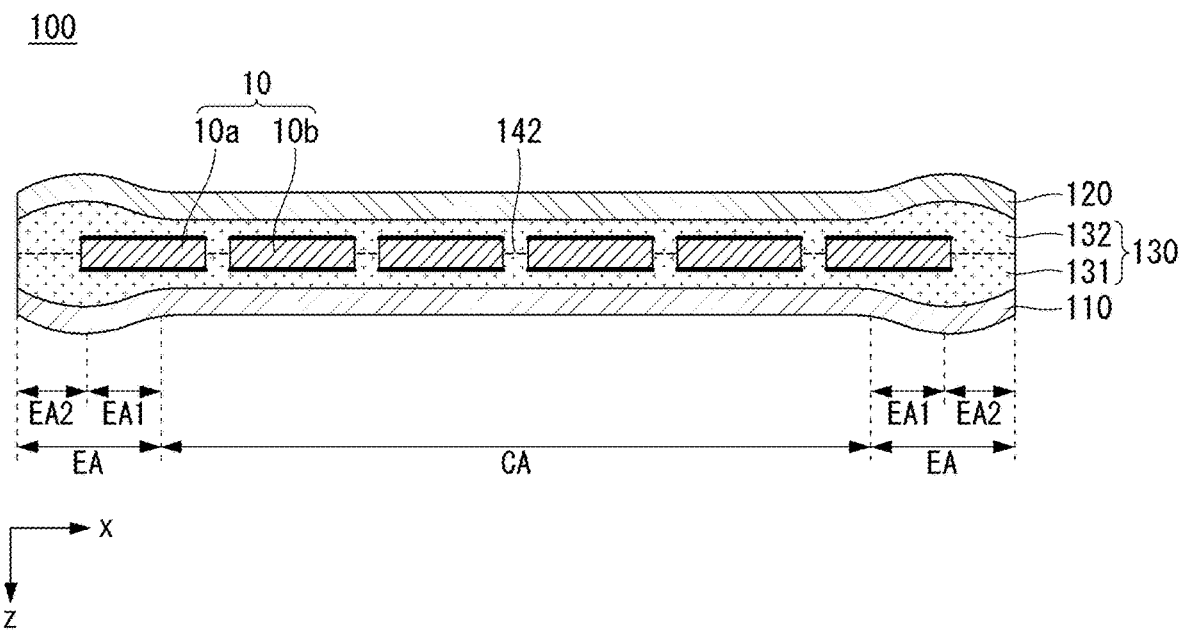
Figure 9:
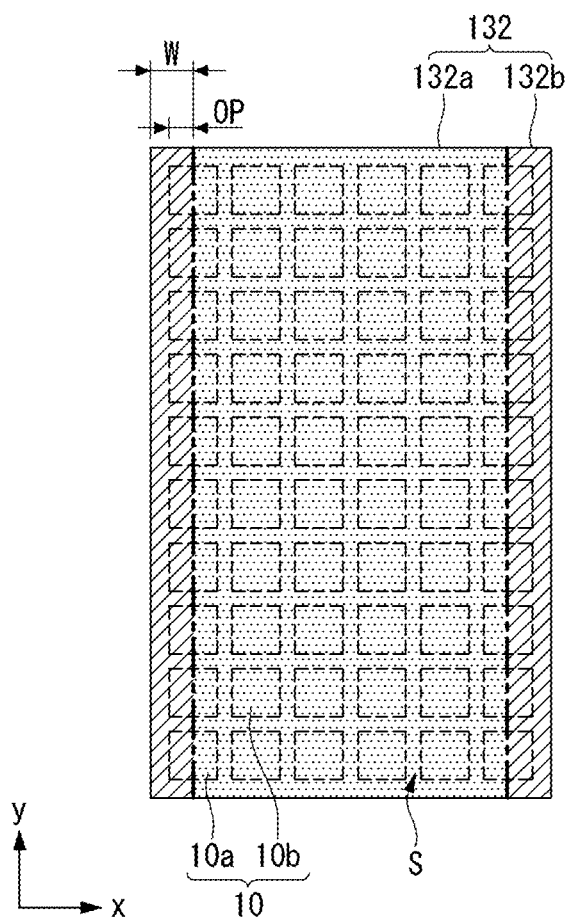
FIG. 9 is a plan view schematically showing a sealing member including a base portion and a reinforcing portion being able to be applied to a solar cell panel according to an embodiment of the invention, together with solar cells.

FIGS. 8A to 8C are views schematically showing a method for manufacturing a solar cell panel 100 according to an embodiment of the invention. FIG. 9 is a plan view schematically showing a sealing member 130 (for example, a second sealing member 132) including a base portion 132a and a reinforcing portion 132b being able to be applied to a solar cell panel 100 according to an embodiment of the invention, together with solar cells 10.

First, as shown in FIG. 8A, in a stacked process, a stacked structure or a laminated structure of a first cover member 110, a first sealing member 131, a solar cell 10, a second sealing member 132, and a second cover member 120 are positioned on a work table 200 of a lamination apparatus. It is shown that the first cover member 110, the first sealing member 131, the solar cell 10, the first sealing member 132, and the second cover member 120 are spaced apart from each other in FIGS. 8A and 8B for a clear understanding. However, they may be actually in contact with each other.

In this instance, at least one of the first and second sealing members 131 and 132 (for example, in this embodiment, the second sealing member 132) may include a base portion 132a and a reinforcing portion 132b positioned on the base portion 132a. The reinforcing portion 132b has an overlapped portion OP overlapping at least a part of the solar cell 10.

When the reinforcing portion 132b is positioned to have the overlapped portion OP overlapping at least a part of the solar cell 10, the effect of the reinforcing portion 132b can be effectively achieved. For example, the reinforcing portion 132b may adjacent to an edge of the solar cell panel 100 and have an overlapped portion OP overlapping at least an outer solar cell 10a. A ratio of a width of the overlapped portion OP to a width of the outer solar cell 10a may be 10% or more. Alternatively, a width W of the reinforcing portion 132b may be 5 cm or more (for example, 7 cm or more). Within this range, effect of the reinforcing portion 132b can be maximized. In this instance, the overlapped portion OP may be positioned so as not to overlap with an inner solar cell 10b.

The first area A1 having only the base portion 132a without the reinforcing portion 132b has an area greater than the second area A2 having the base portion 132a and the reinforcing portion 132b together. That is, a ratio of an area of the reinforcing portion 132b to a total area of the sealing member 130 may be less than 50%. Then, an area of the reinforcing portion 132b can be reduced and thus a material cost of the sealing member 130 can be reduced. However, embodiments of the invention are not limited thereto.

In this instance, the base portion 132a has a predetermined thickness T10 and the reinforcing portion 132b has a predetermined thickness T20. The first area A1 including only the base portion 132a without the reinforcing portion 132b has the thickness T10 of the base portion 132a and the second area A2 including the base portion 132a and the reinforcing portion 132b may have a thickness, which is a sum of the thickness T10 of the base portion 132a and the thickness T20 of the reinforcing portion 132b. For example, the first area A1 may have a thickness of 100 to 600 um, and the second area A2 may have a thickness of 150 to 1100 um. Accordingly, the second area A2 including the reinforcing portion 132b may be relatively thick. The reinforcing portion 132b is partially formed to increase a thickness at a portion where pressure is concentrated during the lamination process and thus the first and second cover members 110 and 120 and/or the solar cell 10 may be damaged, thereby achieving an absorbing shock effect or a reinforcing effect. Since the first area A1 is relatively thin, it is possible to reduce a volume or thickness of the sealing member 130 in the first area A1, thereby reducing the material cost.

Particularly, in the embodiment, a reinforcing sealing member for remaining a reinforcing region EA1 formed at a portion corresponding to at least a portion of the reinforcing portion 132b and having a relatively larger thickness than that of the central region CA after the lamination process may be used. Then, the sealing member 130 can be prevented from flowing or leaking out to the outside by the reinforcing portion 132b of the reinforcing sealing member, and the first and second cover members 110 and 120 and/or the solar cell 10 can be effectively prevented from being damaged or broken by maximizing shock-absorbing effect during the lamination process.

As an example, the thickness T20 of the reinforcing portion 132b may be smaller than the thickness T10 of the base portion 132a. In contrast, if the thickness T20 of the reinforcing portion 132b is large, a step or a thickness different between the first area A1 and the second area A2 is large, and thus, undesirable process defects may occur. For example, the ratio (T20/T10) of the thickness T20 of the base portion 132a to the thickness T10 of the reinforcing portion 132b may be 0.3 to 0.8. However, embodiments of the invention are not limited thereto.

Figure 7:
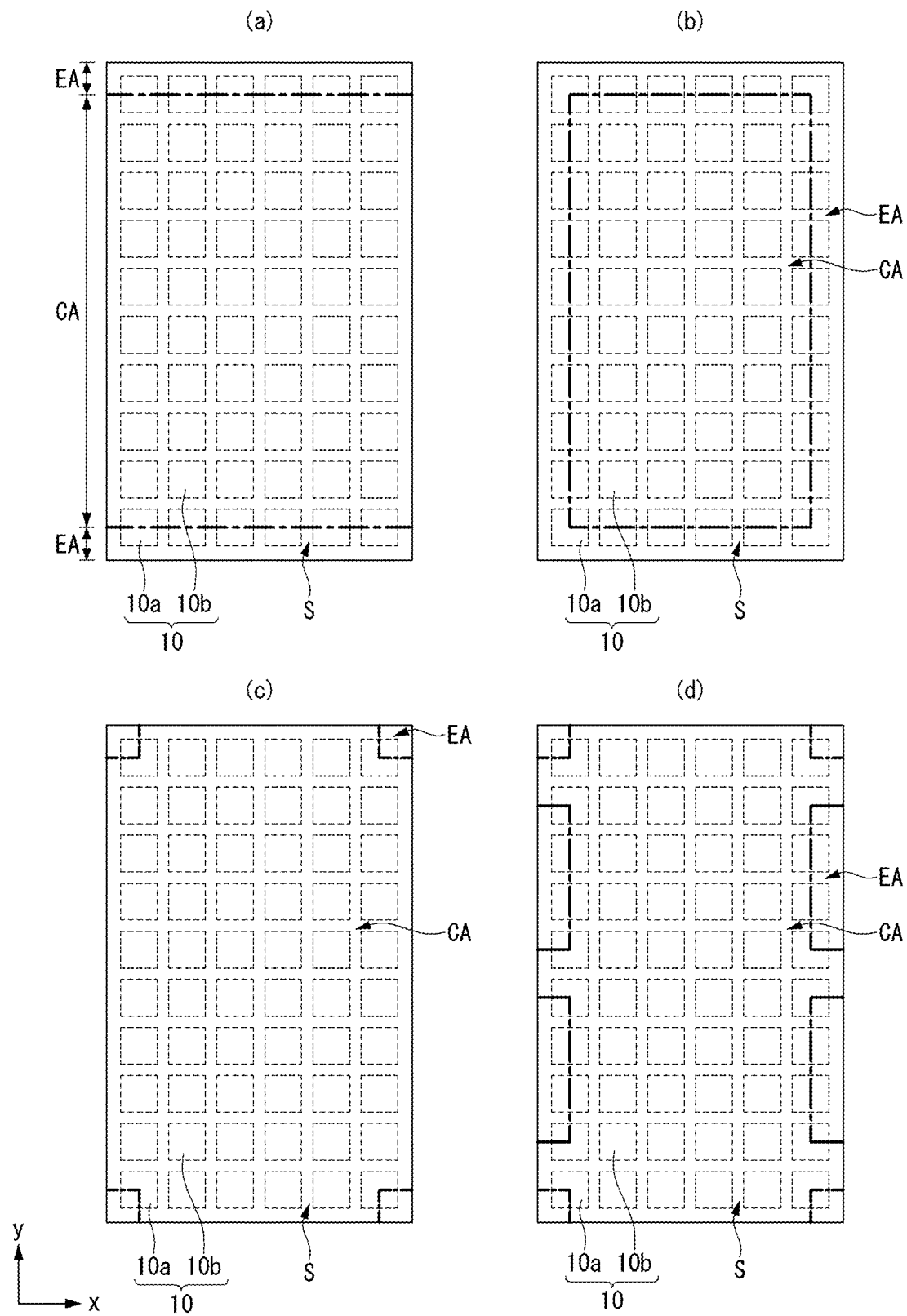
FIG. 7 is a plan view schematically showing solar cell panels according to modified embodiments of the invention.

The reinforcing portion 132b may have a shape corresponding to the outer region EA shown in FIGS. 5 and 7.

For example, as shown in FIG. 9, the reinforcing portion 132 may include reinforcing portions 132b longitudinally extending in a first direction (an x-axis direction in FIG. 9), which a solar cell string S extends, and positioned at both sides of a second direction (an x-axis direction in FIG. 9) crossing the first direction so as to correspond to the outer regions EA shown in FIG. 5. When the reinforcing sealing member having the reinforcing portions 132b are used, outer regions EA as shown in FIG. 5 may be formed.

As a modified embodiment, for example, reinforcing portions 132b may longitudinally extend in a direction crossing a solar cell string S or in a short axis direction so as to correspond to the outer regions EA (or the reinforcing regions EA1) shown in FIG. 7(a). As another example, a reinforcing portion 132b may have a frame shape extending continuously along entire edges of a solar cell panel 100 so as to correspond to the outer region EA shown in FIG. 7(b). As another example, reinforcing portions 132b may be partially positioned at four corners of the solar cell panel 100, respectively, so as to correspond to the outer regions EA shown in FIG. 7(*c*). As still another example, reinforcing portions 132*b* may be positioned in plural in a direction parallel to a solar cell string S or in a long axis direction so as to correspond to the outer regions EA shown in FIG. 7(*d*).

Next, as shown in FIG. 8B, in a lamination process, heat and pressure are applied to the laminated structure 100*a* so that the first cover member 110, the first sealing member 131, the solar cells 10, and the second sealing member 132, and the second cover member 120 are integrated. That is, the sealing member 130 is melted and hardened at a high temperature of the lamination process and is compressed by the pressure and completely fills a space between the first cover member 110 and the second cover member 120 to seal the solar cells 10. Thereby, the solar cell panel 100 as shown in FIG. 8C is manufactured. For example, the first cover member 110, the first sealing member 131, the solar cells 10, the first sealing member 132, and the second cover member 120 may be integrated by providing air pressure. According to this, the lamination process can be performed without applying a large pressure to the solar cell 10 or the like.

If the reinforcing sealing member including the reinforcing portion 132*b* is not used, damage or breakage of the first and second cover members 110 and 120 and/or the solar cell 10 may occur severely during the lamination process in the manufacturing of the solar cell panel 100 in which each of the first and second cover members 110 and 120 is formed of a glass substrate. In the embodiment, the reinforcing sealing member having the reinforcing portion 132*b* may be used to effectively prevent damage or breakage of the first and second cover members 110 and 120 and/or the solar cell 10.

As described above, in this embodiment, the sealing member 130 has the central region CA and the outer region EA (for example, the reinforcing region EA1) having different thicknesses after the lamination process, and an area (a reinforcing area) having a thickness greater than that of a central area may be provided at an outer area of the solar cell panel 100. By this structure, the reduction in the thickness of the sealing member 130, which may occur at the edge of the solar cell panel 100 due to the flow or leakage of the sealing member 130 to the outside, can be effectively prevented, and the damage or breakage of the first and second cover members 110 and 120 and/or the solar cell 10 can be prevented more effectively. Thus, a defect rate in the manufacturing of the solar cell panel 100 can be reduced.

It is exemplified that the base portion 132*a* and the reinforcing portion 132*b* are formed of the same material to form an integral structure and the reinforcing sealing member having the reinforcing portion 132*b* has a single body in FIGS. 8A to 8C. Such reinforcing sealing member may be formed by extrusion. For example, the reinforcing sealing member having the reinforcing portion 132*b* may be formed by extrusion processing using T-die, calendering or the like.

Figure 10:
FIG. 10 is a cross-sectional view showing a sealing member including a base portion and a reinforcing portion being able to be applied to a solar cell panel according to another embodiment of the invention.

However, embodiments of the invention are not limited thereto. As a modified embodiment, as shown in FIG. 10, a base portion 132*a* and a reinforcing portion 132*b* may be formed of different materials or may be formed separately. The base portion 132*a* and the reinforcing portion 132*b* may be used with a structure where the base portion 132*a* and the reinforcing portion 132*b* are attached by an adhesive layer (not shown). Alternatively, the reinforcing portion 132*b* may be used in a state that the reinforcing portion 132*b* is placed on the base portion 132*a* without an additional adhesive layer to form a part of a laminated structure. When the base portion 132*a* and the reinforcing portion 132*b* include different materials, the reinforcing portion 132*b* may be formed of a material capable of maximizing the shock-absorbing effect. For example, the reinforcing portion 132*b* may have a lower hardness and a higher elasticity than the base portion 132*a*, thereby maximizing the shock-absorbing effect. However, embodiments of the invention are not limited thereto, and the base portion 132*a* and the reinforcing portion 132*b* may have any of various materials.

Figure 11:
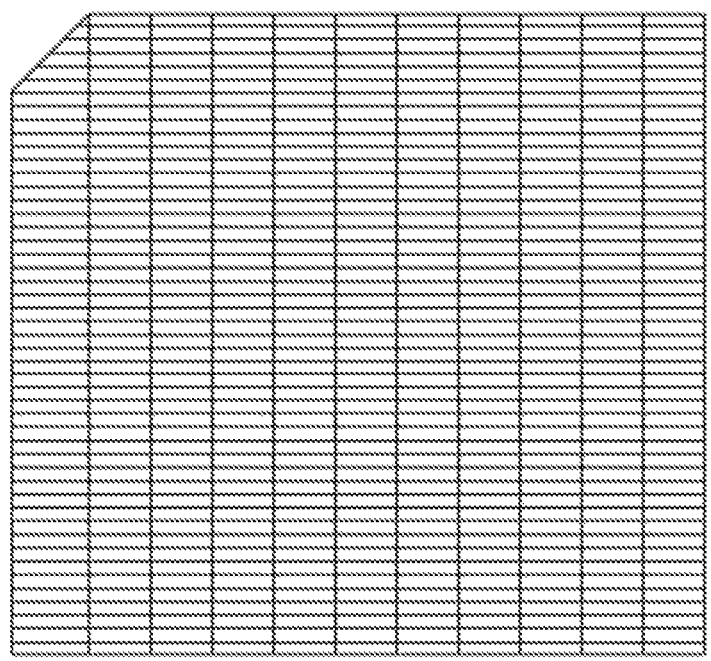
FIG. 11 is photographs of solar cell panels according to an embodiment of the invention and a comparative example.
Figure 11:
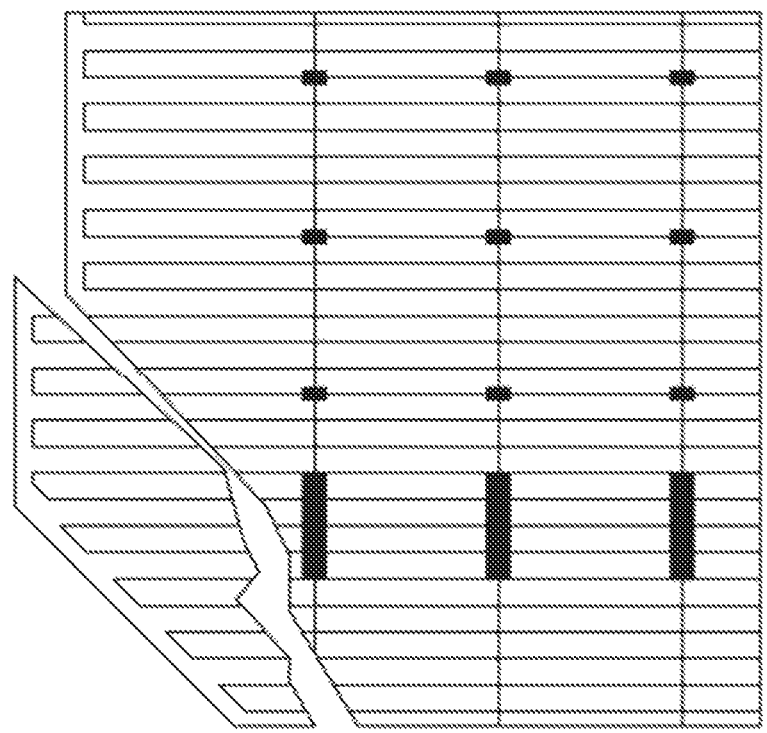

FIG. 11(*a*) is a photograph of a solar cell panel having a reinforced sealing member including a reinforcing portion 132*b* as in the embodiment of the invention, and FIG. 11(*b*) is a photograph of a solar cell panel according to a comparative example having a sealing member not provided with a reinforcing portion. The solar cell panels according to the embodiment and the comparative example had the same structure, material, property, or so on except whether the sealing member had a reinforcing portion or not. The breakage of the solar cell panel according to the embodiment of the invention was not occurred as shown in FIG. 11(*a*), while the breakage of the solar cell panel according to the comparative example was occurred as shown in FIG. 11(*b*). It can be seen from the same that the first and/or second sealing members 131 and/or 132 having the reinforcing portion 132*b* can prevent the solar cell from being broken in the lamination process.

In the embodiment, a process time of the lamination process can be effectively shortened because the lamination process can be performed at a high temperature and/or a sufficient pressure by the reinforcing portion 132*b*. For example, the process time of the lamination process can be shortened up to 20%. On the other hand, a portion of the first and/or second sealing members 131 and/or 132, in which relatively small pressure is applied during the lamination process, only the base portion 132*a* having a relatively small thickness is positioned, and thus, a material cost of the sealing member 130 can be minimized. As a result, productivity in manufacturing the solar cell panel 100 can be greatly improved.

Hereinafter, a solar cell panel according to another embodiment of the invention will be described in detail. Detailed descriptions will be omitted for the same or extremely similar parts as those described above, and only different parts will be described in detail. It is also within the scope of the invention to combine the above-described embodiments or modifications thereof with the following embodiments or modifications thereof.

Figure 12:
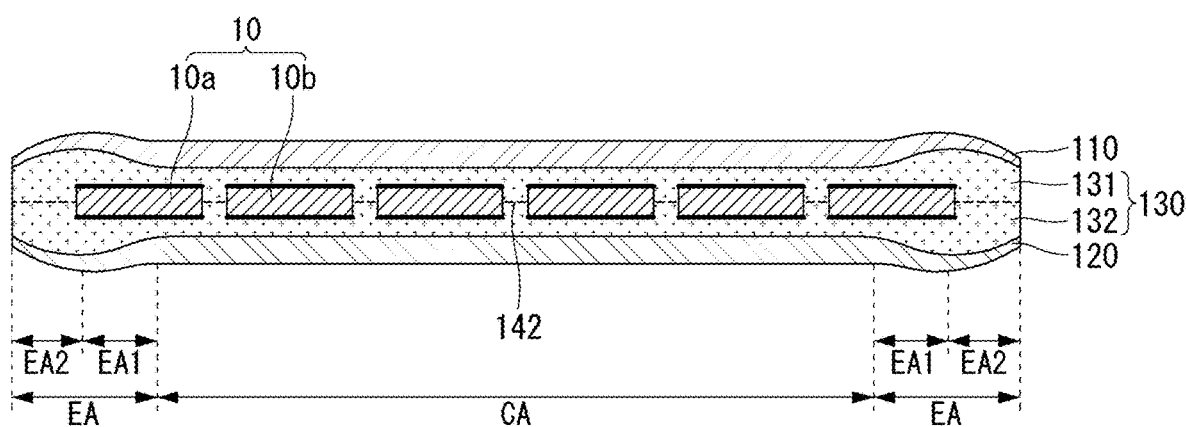
FIG. 12 is a cross-sectional view showing a solar cell panel according to yet another embodiment of the invention.

FIG. 12 is a cross-sectional view showing a solar cell panel according to yet another embodiment of the invention.

Referring to FIG. 12, in a solar cell panel 100 according to the embodiment, at least one of the first and second cover members 110 and 120 may include portions having different thicknesses.

For example, as in the above-described embodiment, a sealing member 130 includes a central region CA, and an outer region EA positioned outside the central region CA and including a reinforcing region EA1 having a thickness greater than that of the central region CA. The first or second cover member 110 or 120 may include a central portion and an outer portion having a thickness smaller than that of the central portion. This is because the thickness of the outer portion of the first or second cover member 110 or 120 may be thinner than the center portion of the first or second cover member 110 or 120 by a rolling process in a manufacturing process of the first or second cover member 110 or 120 formed of a glass substrate. In this instance, an outer area of the solar cell panel 100 may include a reinforcing area of the solar cell panel 100 having a thickness greater than that of a central area of the solar cell panel 100, or may have a thickness the same as or smaller than a thickness of the central area of the solar cell panel 100.

It is exemplified that each of the first and second cover members 110 and 120 has an outer portion having a relatively thin thickness in FIG. 12. However, embodiments of the invention are not limited thereto, and at least one of the first and second cover members 110 and 120 may have an outer portion having a relatively thin thickness. In addition, it is exemplified that outer portions positioned at both edges of the first and second cover members 110 and 120 have a relatively thin thickness in FIG. 12. However, embodiments of the invention are not limited thereto, and an outer portion positioned at at least one of edges of the first and second cover members 110 and 120 may have a relatively thin thickness. In this instance, a reinforcing portion 132*b* (see FIG. 8A, 9, or 10), a reinforcing region EA1, or the like may be positioned in consideration of a position or the like of an outer portion having a relatively thin thickness.

Figure 13:
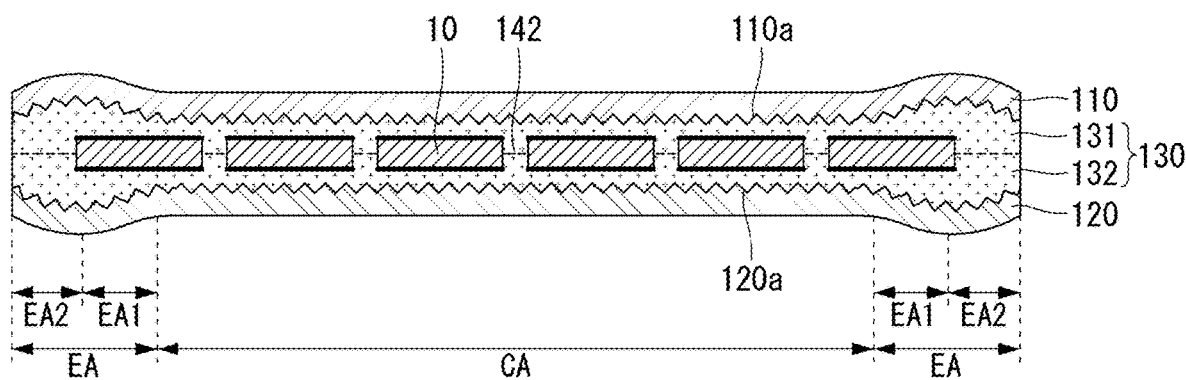
FIG. 13 is a cross-sectional view showing a solar cell panel according to still another embodiment of the invention.

FIG. 13 is a cross-sectional view showing a solar cell panel according to still another embodiment of the invention.

Referring to FIG. 13, in a solar cell panel 100 according to the embodiment, an anti-reflection structure 110*a* or 120*a* for preventing reflection may be formed at a surface (particularly, an inner surface) of first or second cover members 110 or 120. The anti-reflection structure 110*a* or 120*a* may be formed of protruded portions, indentation, uneven portion, irregularities having any of various shapes, sizes, and the like that can increase surface roughness. An output of the solar cell panel 100 can be improved by maximizing an amount of light incident on the solar cell panel 100 by the anti-reflection structures 110*a* and 120*a*.

However, when the anti-reflection structures 110*a* and 120*a* are provided, the sealant 130 may flow or leak out to an outside more due to the pressure applied during a lamination process. In this structure, as in the above-described, the sealing member 130 has a central region CA, and an outer region EA positioned outside the central region CA and including a reinforcing region EA1 having a thickness greater than that of the central region CA. Then, the sealing member 130 can be effectively prevented from flowing or leaking out to the outside in the structure in which the sealing member 130 may relatively easily flow or leak to the outside.

It is exemplified that the solar cell panel 100 has a thickness shape similar to that of the sealing member 130 because the first and second cover members 110 and 120 have a uniform thickness in FIG. 13. However, embodiments of the invention are not limited thereto, and at least one of the first and second cover members 110 and 120 may include portions having different thicknesses as in the embodiment with reference to FIG. 12. Also, it is exemplified that the first and second cover members 110 and 120 have the anti-reflection structures 110*a* and 120*a*, respectively, in FIG. 13. However, embodiments of the invention are not limited thereto, and at least one of the first and second cover members 110 and 120 may have the anti-reflection structure 110*a* or 120*a*. Further, it is exemplified that the anti-reflection structures 110*a* and 120*a* are formed on inner surfaces of the first and second cover members 110 and 120, respectively, in FIG. 13. However, embodiments of the invention are not limited thereto, and the anti-reflection structure 110*a* or 120*a* may be formed at an outer surface of the first or second cover member 110 or 120. Various other variations are possible.

In the above-described embodiments, it is exemplified that at least a part of the outer region EA (for example, the reinforcing region EA1 or the edge region EA2) is thicker than the central region CA. However, embodiments of the invention are not limited thereto. Another embodiment will be described with reference to FIG. 14.

Figure 14:
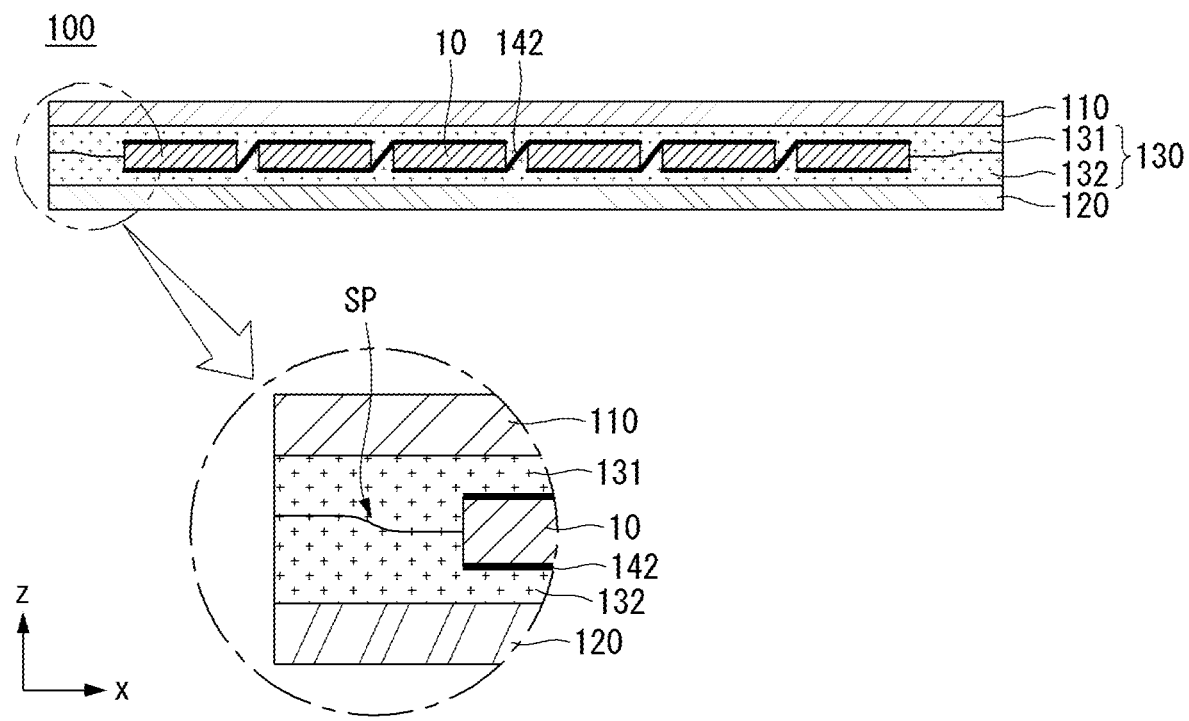
FIG. 14 is a cross-sectional view showing a solar cell panel according to still yet another embodiment of the invention.

FIG. 14 is a cross-sectional view showing a solar cell panel according to still yet another embodiment of the invention.

As shown in FIG. 14, even when the first and/or second sealing members 131 and/or 132 are formed by using a reinforcing sealing member, a central region CA (see FIG. 6) and an outer region EA (see FIG. 6) have substantially the same thickness and thus a thickness of the solar cell panel 100 may be uniform. In this instance, a density of at least a part of the outer region EA (for example, a reinforcing region EA1 (see FIG. 6) or an edge region EA2 (see FIG. 6)) may be greater than a density of the central region CA, or a step SP or an inclined portion where a thickness of a first or second sealing member 131 or 132 varies may be positioned at the outer region of the solar cell panel 100. This is because a portion of the reinforcing sealing member where a relatively thick reinforcing portion 132*b* (see FIG. 8A) has to be compressed to the same level as the other portions, and thus, the density of the corresponding portion may become larger or the thickness thereof may be changed. However, in such a case, buffering or shock-absorbing due to the reinforcing region EA1 may be not sufficient during the lamination process, and thus, the effect of preventing the sealing member 130 from flowing or leaking out to the outside or preventing the cover members 110 and 120 from being damaged may not be sufficient.

In FIG. 4, it is exemplified that three bus bar electrodes 42*b* and 44*b* and three interconnectors 142 are provided based on one surface of the solar cell 10, but embodiments of the invention are not limited thereto. Each of a number of the bus bar electrodes 42*b* and 44*b* and a number of the interconnectors 142 connected to the bus bar electrodes 42*b* and 44*b* in one-to-one correspondence may be two or more.

Figure 15:
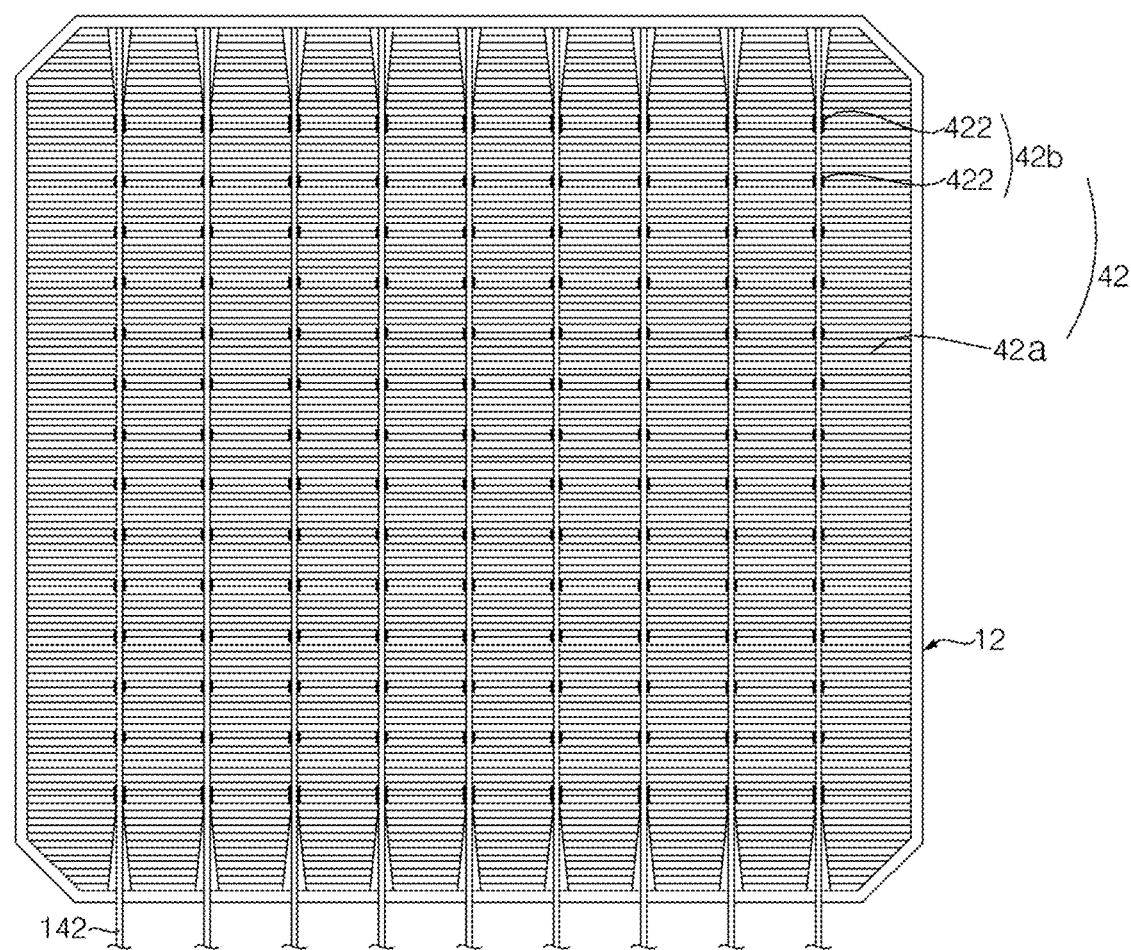
FIG. 15 is a front plan view showing a solar cell and a plurality of wiring members connected thereto, which are included in a solar cell panel according to another embodiment of the invention.
Figure 16:
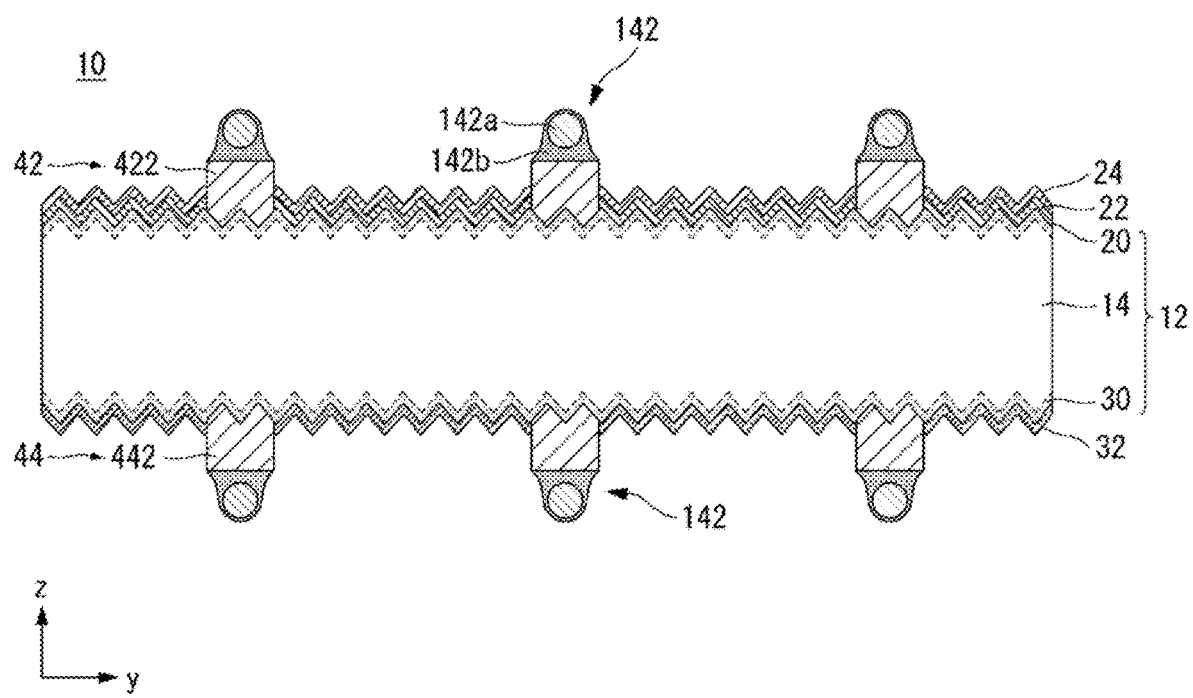
FIG. 16 is a partial cross-sectional view of the solar cell and the plurality of wiring members shown in FIG. 15.

For example, the interconnector 142 may be formed of a wiring member of a wire shape. Such an example will be described in detail with reference to FIGS. 15 and 16. FIG. 15 is a front plan view showing a solar cell and a plurality of wiring members connected thereto, which are included in a solar cell panel according to another embodiment of the invention. FIG. 16 is a partial cross-sectional view of the solar cell and the plurality of wiring members shown in FIG. 15.

Referring to FIGS. 15 and 16, an interconnector 142 including a wiring member of a wire shaped is provided in a number larger than a number of ribbons (for example, 2 to 5) based on one surface of each solar cell 10. Then, a movement distance of carriers can be reduced by a large number of wiring members while minimizing a light loss and a material cost by the wiring member of a small width. Thus, an efficiency of the solar cell 10 and a output of the solar cell panel 100 can be improved by reducing the movement distance of the carriers while reducing the light loss and the material cost due to the wiring member.

For example, each of a number of the bus bar electrodes 42*b* and a number of the interconnectors 142 may be 6 to 33 (for example, 8 to 33, for example, 10 to 33, in particular, 10 to 15), and a plurality of bus bar electrode 42*b* and a plurality of interconnectors 142 may be positioned at a uniform intervals or pitches from one another.

The wiring member of the wire shape may have a smaller width than a ribbon having a relatively wide width (for example, more than 1 mm). For example, a maximum width of the wiring member may be 1 mm or less (for example, 500 μm or less, more specifically, 250 to 500 μm). Here, the maximum width of the wiring member may mean the greatest width passing through a center of the wiring member among widths. When the wiring member has the maximum width described above, a resistance of the wiring member can be low and a light loss can be minimized, and the wiring member can be stably attached to the solar cell 10.

In order to simplify a process of attaching the wiring members to the solar cell 10 when a large number of wiring members having such a small width are used, in the embodiment, the wiring member may include a core layer 142a, and a solder layer 142b formed on a surface of the core layer 142a. Then, a large number of the wiring members can be effectively attached by a step of applying heat and pressure in a state where the plurality of wiring member are placed on the solar cell 10.

The wiring member or the core layer 142a, which is included in the wiring member to form a most portion of the wiring member, may have a rounded portion. That is, at least a part of a cross-section of the wiring member or the core layer 142a may have a circular shape, a part of a circular shape, an ellipse, a part of an ellipse, or a curved portion.

When the wiring member or the core layer 142a has the above structure, the solder layer 142b may be formed entirely on a surface of the core layer 142a to form the wiring member. Then, an additional process for applying a solder material may be omitted, and the wiring members can be attached to the solar cell by positioning the wiring members directly on the solar cell 10. Thus, a process of attaching the wiring members can be simplified. In addition, reflection or scattered reflection is induced at the rounded portion of the wiring member, and light reflected on the wiring member can be re-incident to the solar cell 10 and reused. Accordingly, an amount of light incident to the solar cell 10 can be increased, and thus, an efficiency of the solar cell 10 and an output of the solar cell panel 100 can be improved. However, embodiments of the invention are not limited thereto. Therefore, a wire constituting the wiring member may have a polygonal shape such as a quadrangle, or may have any of various other shapes.

In the embodiment, the wiring member includes a core layer 142a formed of a metal, and a solder layer 142b formed on a surface of the core layer 142a and including a solar material being able to be soldered with electrodes 42. That is, the solder layer 142b can serve as a kind of adhesive layer. For example, the core layer 142a may include Ni, Cu, Ag, Al or the like as a main material (for example, a material containing 50 wt % or more, or more specifically, a material containing 90 wt % or more). The solder layer 142b may include a solder material such as Pb, Sn, SnIn, SnBi, SnPb, SnPbAg, SnCuAg, SnCu, or the like as a main material. However, embodiments of the invention are not limited thereto, and the core layer 142a and the solder layer 142b may include any of various materials.

On the other hand, when the wiring member is attached to the solar cell 10 by a tabbing process, as shown in FIG. 16, a shape of the solder layer 142b in a portion of the wiring member attached to or connected to the solar cell 10 may be changed.

More specifically, the wiring member is attached to the bus bar electrode 42b (for example, a plurality of pad portions 422 positioned in a longitudinal direction of the bus bar electrode 42b) by the solder layer 142b. When the wiring members are attached to the solar cell by a tabbing process, each solder layer 142b may be entirely flowed downward toward the first electrode 42 or the second electrodes (more specifically, the pad portions 422) during the tabbing process. Then, a width of the solder layer 142b at portions adjacent to the pad portions 422 or between the pad portions 422 and the core layer 142a may increase gradually toward to the pad portions 422. In one example, a portion of the solder layer 142b adjacent to the pad portion 422 may have a width equal to or greater than a width or a diameter of the core layer 142a. In this instance, the width of the solder layer 142b may be equal to or less than a width of the pad portion 422.

In a structure including a plurality of wiring members as described above, some wiring members are positioned close to an edge of the solar cell 10, and thus, more pressure may be applied to the solar cell 10 during a lamination process. In addition, since the plurality of wiring members have a rounded shape or a relatively thicker thickness than a width, an effect of dispersing a pressure in the lamination process may be less than that of a ribbon having a flat shape. When the wiring member is provided as described above, a pressure dispersion effect in the lamination process may be not so large, and there may be more problems such as cracking in the solar cell 10 or the like during the lamination process. The sealing member 130 according to the embodiment is applied to this structure, and it is possible to effectively prevent a problem such as a crack in the solar cell 10 or the like during the lamination process.

This work is based on a support of national research and development projects of the Republic of Korea, that is, a project number of 20163010012430 (Ministry Name: Ministry of Trade, Industry and Energy (MOTIE), Research Management Institution: Korea Institute of Energy Technology Evaluation and Planning (KETEP)) and a project number of 1415148844 (Ministry Name: Ministry of Trade, Industry and Energy (MOTIE), Research Management Institution: Korea Institute for Advanced of Technology (KIAT)).

The features, structures, effects and the like according to the above-described embodiments are included in at least one embodiment of the invention and are not necessarily limited to one embodiment. Further, the features, structures, effects and the like illustrated in the embodiments can be combined and modified by other persons skilled in the art to which the embodiments belong. Therefore, it is to be understood that embodiments of the invention are not limited to these embodiments.

What is claimed is:

1. A solar cell panel, comprising:
   a solar cell;
   a sealing member including a first sealing member disposed on a first surface of the solar cell and a second sealing member disposed on a second surface of the solar cell;
   a first cover member disposed on the first sealing member and including a glass substrate; and
   a second cover member disposed on the second sealing member and including a glass substrate,
   wherein the sealing member includes a central region and an outer region positioned outside the central region,
   wherein the outer region includes a reinforcing region having a thickness greater than a thickness of the central region,
   wherein the solar cell comprises a plurality of solar cells including an outer solar cell positioned at an outer side and an inner solar cell positioned at the inner side of the outer solar cell,
   wherein the reinforcing region overlaps at least apart of the outer solar cell, and wherein the reinforcing region is positioned not to overlap the inner solar cell.

2. The solar cell panel of claim 1, wherein the outer region further includes an edge region outside the reinforcing region and having an edge, and
wherein the edge region has a thickness smaller than the thickness of the reinforcing region.

3. The solar cell panel of claim 2, wherein a thickness of the edge of the sealing member is less than or equal to the thickness of the central region.

4. The solar cell panel of claim 1, wherein the thickness of the reinforcing region is greater than the thickness of the central region by at least 30 um or more, or a ratio of a difference between the thickness of the reinforcing region and the thickness of the center region to the thickness of the central region is 10% or more.

5. The solar cell panel of claim 1, wherein the reinforcing region includes a portion gradually increasing in thickness toward an edge of the outer solar cell.

6. The solar cell panel of claim 1, wherein the outer region further includes an edge region outside the reinforcing region and having an edge,
wherein the edge region has a thickness smaller than the thickness of the reinforcing region, and
wherein the edge region gradually decreases in thickness toward an edge of the solar cell panel.

7. The solar cell panel of claim 1, wherein the solar cell panel includes an outer solar cell panel area positioned outside a central area of the solar panel and including a reinforcing solar panel area having a thickness greater than a thickness of the central area of the solar panel.

8. The solar cell panel of claim 7, wherein the outer solar panel area of the solar cell panel further includes an edge area outside the reinforcing solar panel area and having an edge, and
wherein the edge area has a thickness smaller than the thickness of the reinforcing solar panel area.

9. The solar cell panel of claim 1, wherein the central region has an area greater than each of an area of the reinforcing region and an area of the outer region.

10. The solar cell panel of claim 1, wherein the solar cell includes a plurality of solar cells electrically connected in one direction to form a solar cell string, and
wherein the outer region or the reinforcing region includes outer regions or reinforcing regions extending in the one direction and located at opposite edges.

11. The solar cell panel of claim 1, wherein the solar cell includes a plurality of solar cells connected in one direction by a plurality of wiring members,
wherein a width of each of the plurality of wiring members is 250 μm to 500 μm, or each of the plurality of wiring members has a circular shape or a rounded portion, and
wherein a number of the plurality of wiring members is 6 to 33.

* * * * *